United States Patent
Sudo

(10) Patent No.: US 8,614,138 B2
(45) Date of Patent: Dec. 24, 2013

(54) MANUFACTURING METHOD OF SEMICONDUCTOR DEVICE

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/591,487

(22) Filed: Aug. 22, 2012

(65) Prior Publication Data

US 2013/0230965 A1      Sep. 5, 2013

(30) Foreign Application Priority Data

Mar. 5, 2012    (JP) .................. 2012-047956

(51) Int. Cl.
   *H01L 21/76*    (2006.01)

(52) U.S. Cl.
   USPC .......................................... 438/437; 438/424

(58) Field of Classification Search
   USPC .................................. 438/424, 427
   See application file for complete search history.

(56) References Cited

U.S. PATENT DOCUMENTS

| | | | |
|---|---|---|---|
| 2007/0004117 A1 | 1/2007 | Yagishita | |
| 2010/0081240 A1 | 4/2010 | Yagishita | |
| 2013/0034948 A1* | 2/2013 | Huang et al. | 438/424 |

OTHER PUBLICATIONS

Sudo, "Method for Manufacturing Semiconductor Device", U.S. Appl. No. 13/421,729, filed Mar. 15, 2012.
Sudo, "Method for Manufacturing Semiconductor Device", U.S. Appl. No. 13/417,524, filed Mar. 12, 2012.

* cited by examiner

*Primary Examiner* — William D Coleman
*Assistant Examiner* — John M Parker
(74) *Attorney, Agent, or Firm* — Finnegan, Henderson, Farabow, Garrett & Dunner, L.L.P.

(57) ABSTRACT

According to one embodiment, a manufacturing method of a semiconductor device includes forming a lower mask film on a semiconductor substrate. The method includes forming a barrier film in a first area. The method includes forming an upper mask film. The method includes removing an upper mask member and leaving a lower mask member in the first area and removing the upper mask member and the lower mask member in the second area. The removing is performed by etching in a condition in which an etching rate of the upper mask member and an etching rate of the lower mask member are higher than that of the barrier member. The method includes forming a conductive film. The method includes selectively removing the conductive film by performing etching in a condition in which an etching rate of the conductive film is higher than that of the lower mask member.

12 Claims, 24 Drawing Sheets

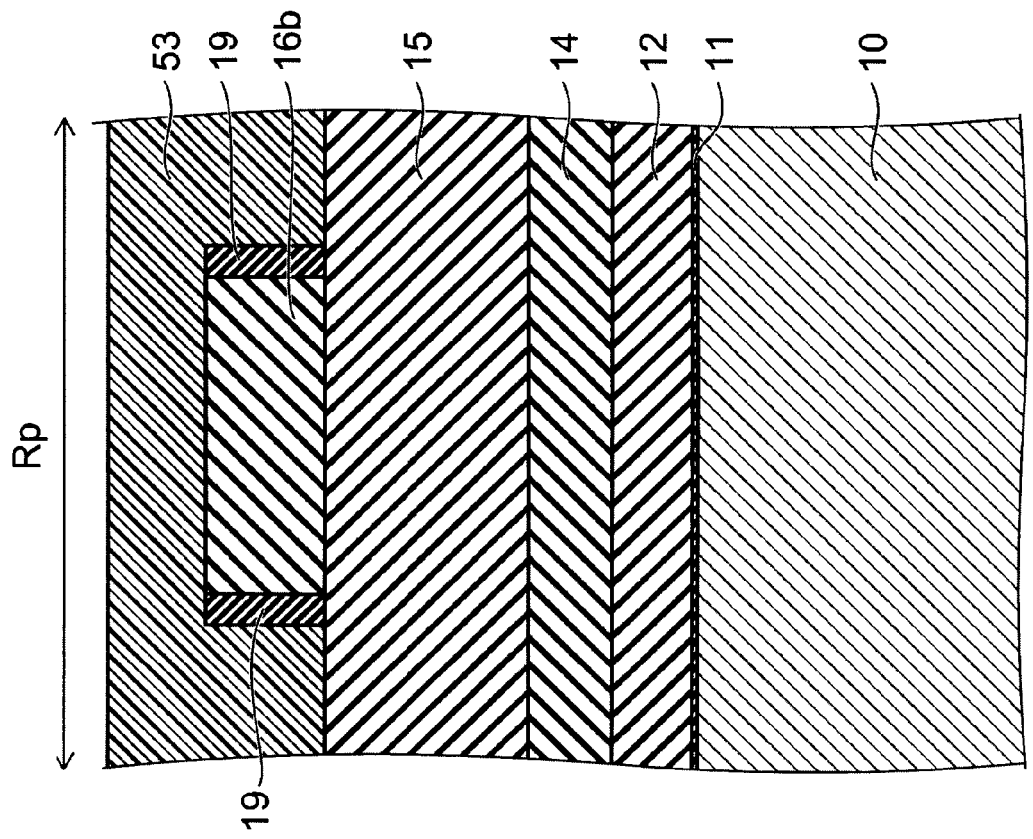
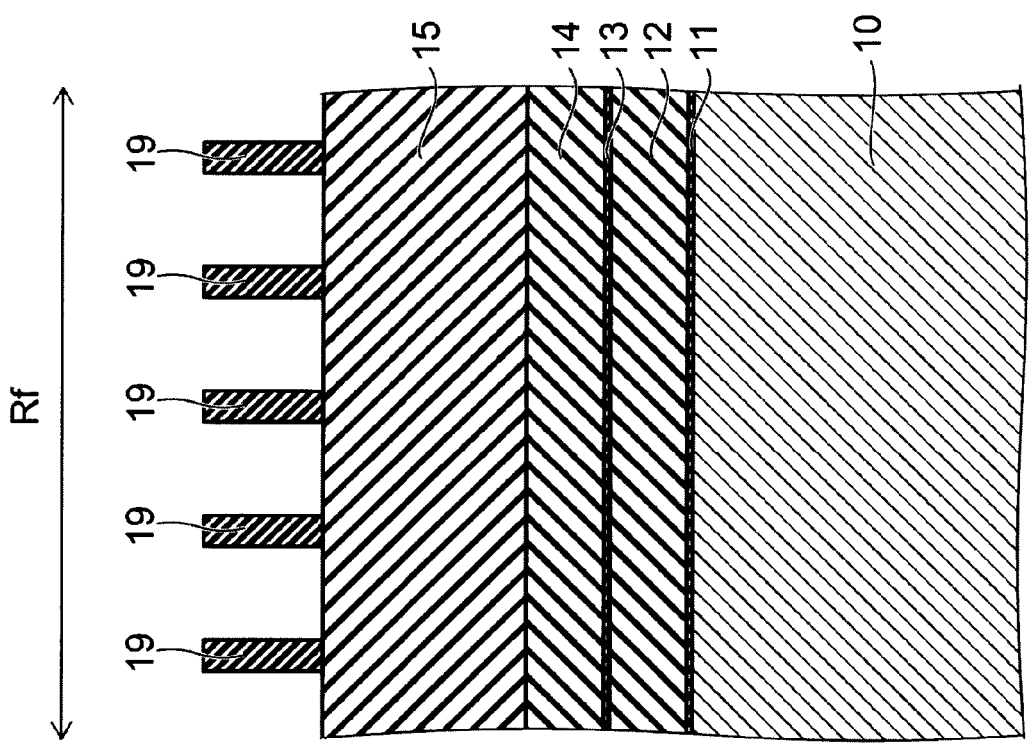
FIG. 5B
FIG. 5A

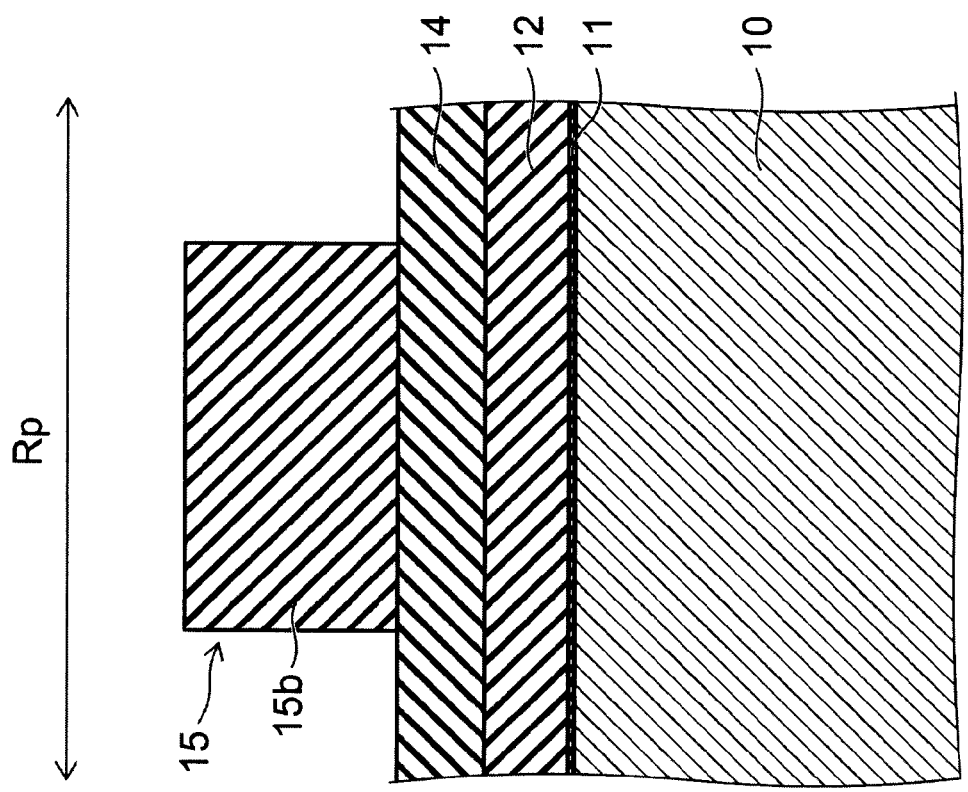
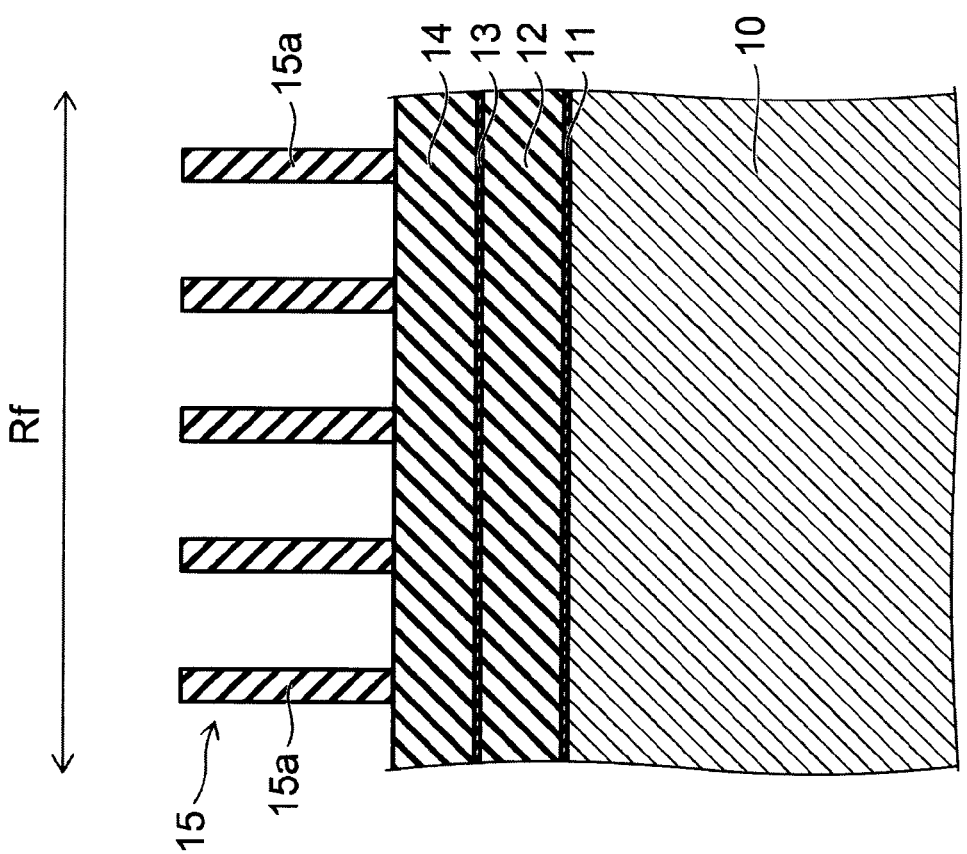

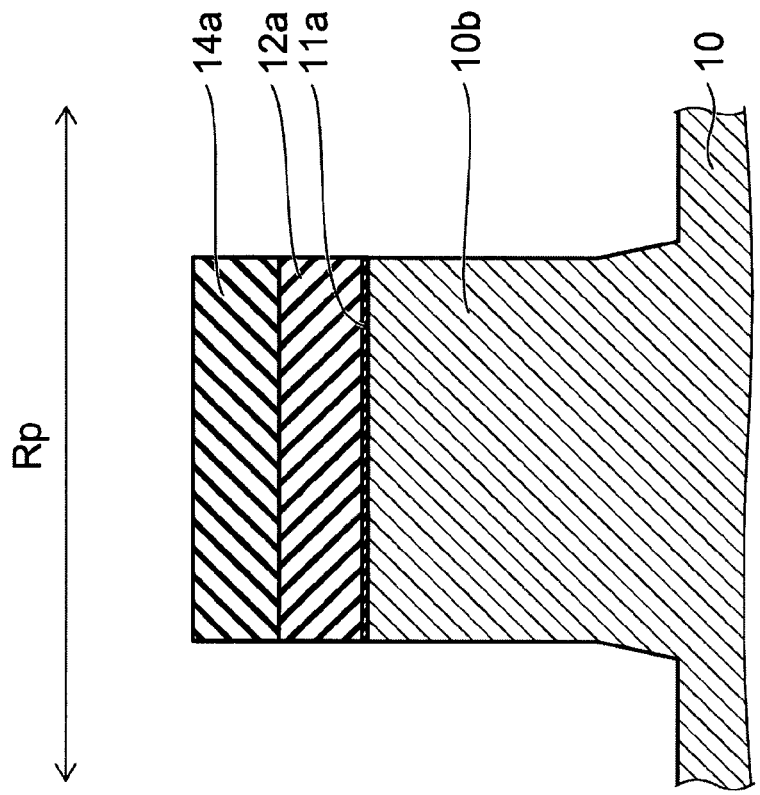
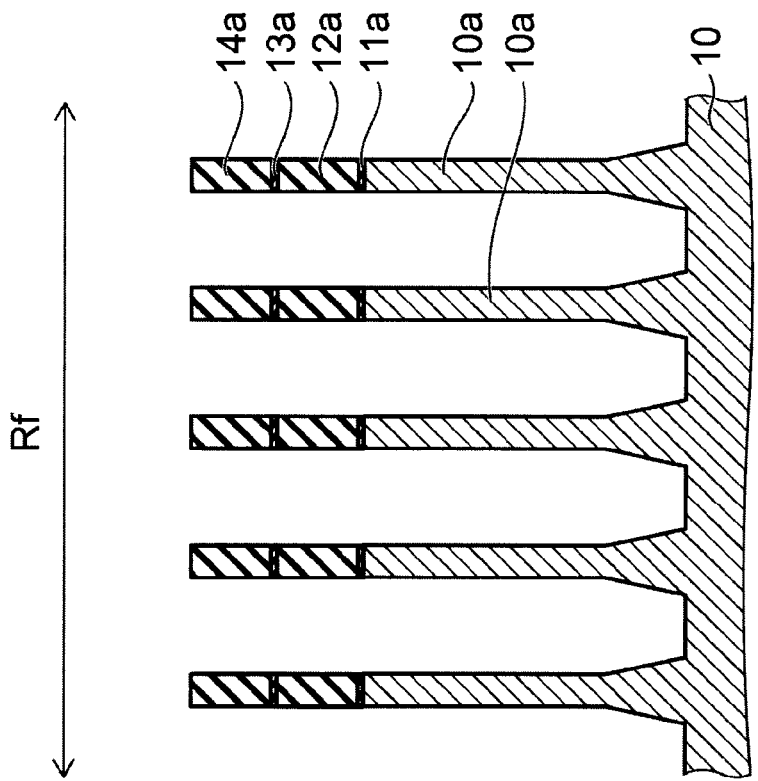

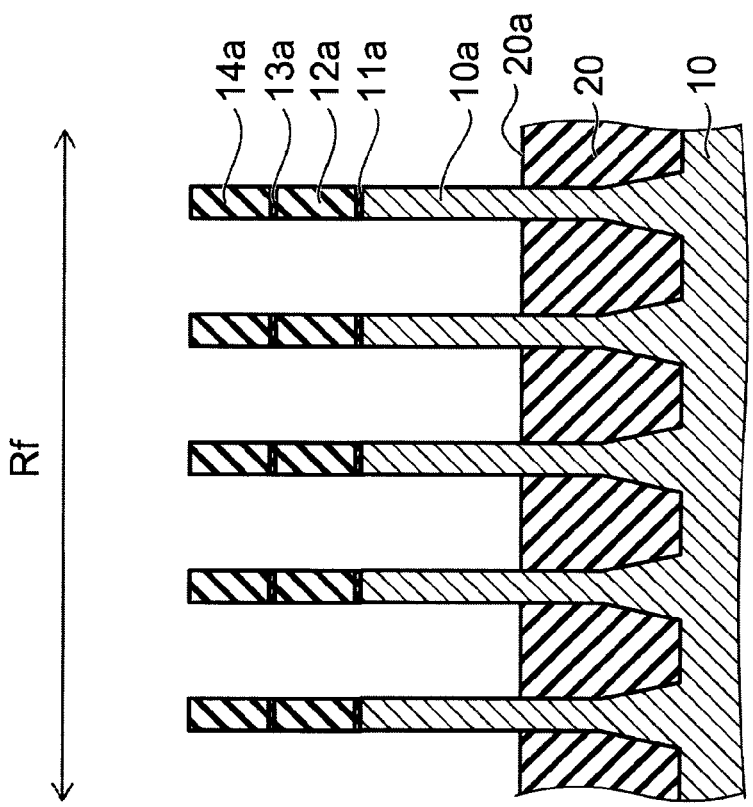
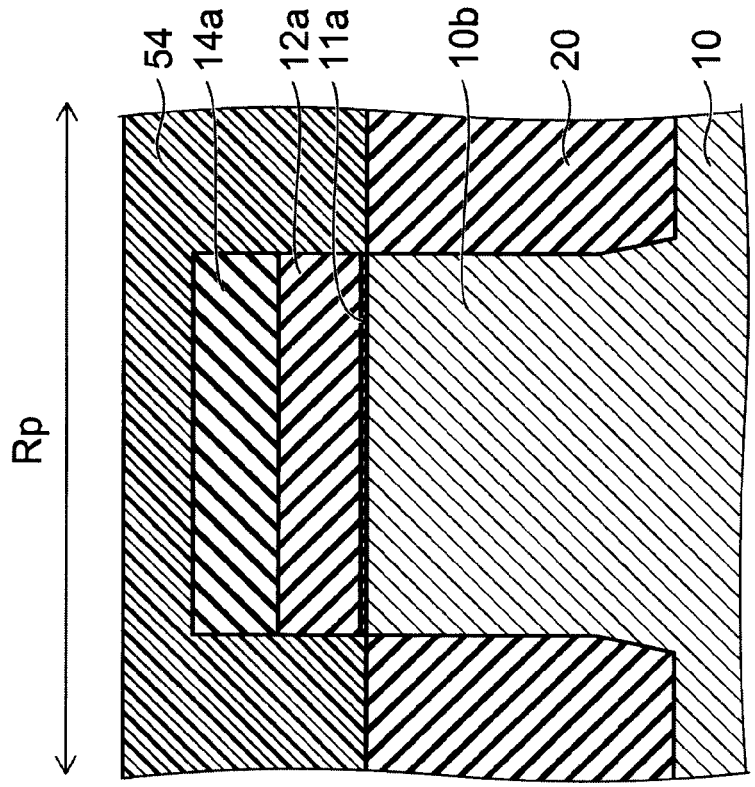
FIG. 10A
FIG. 10B

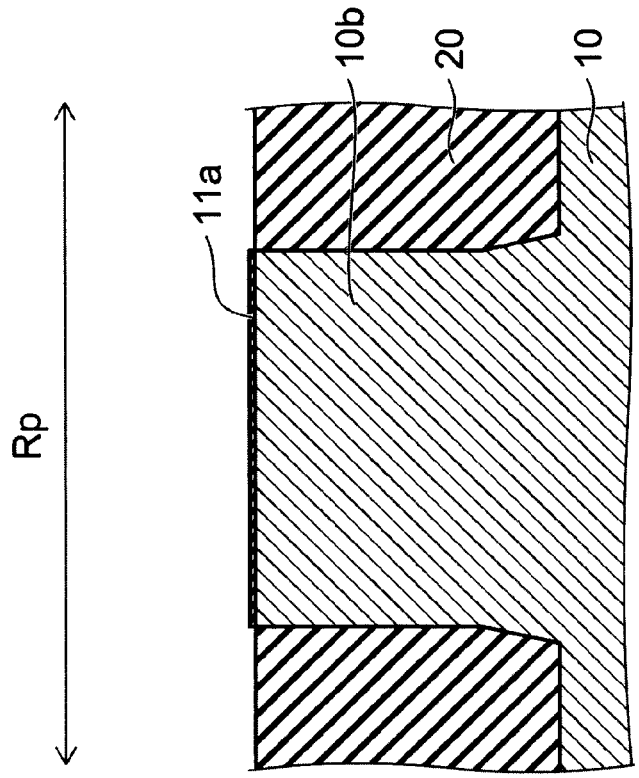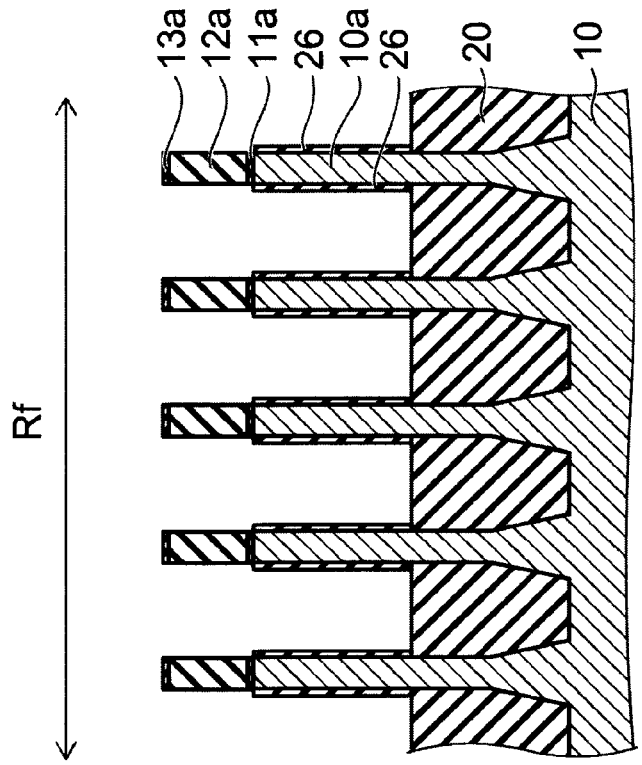
FIG. 13A
FIG. 13B

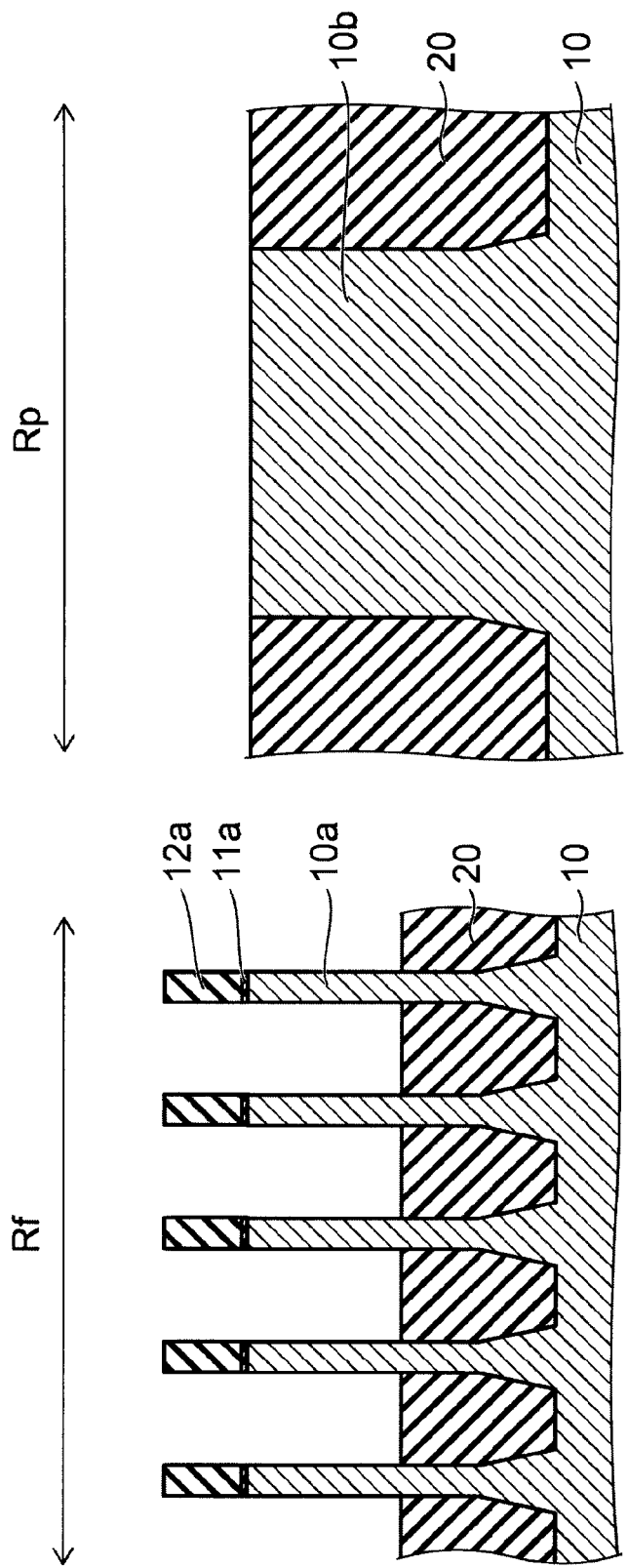

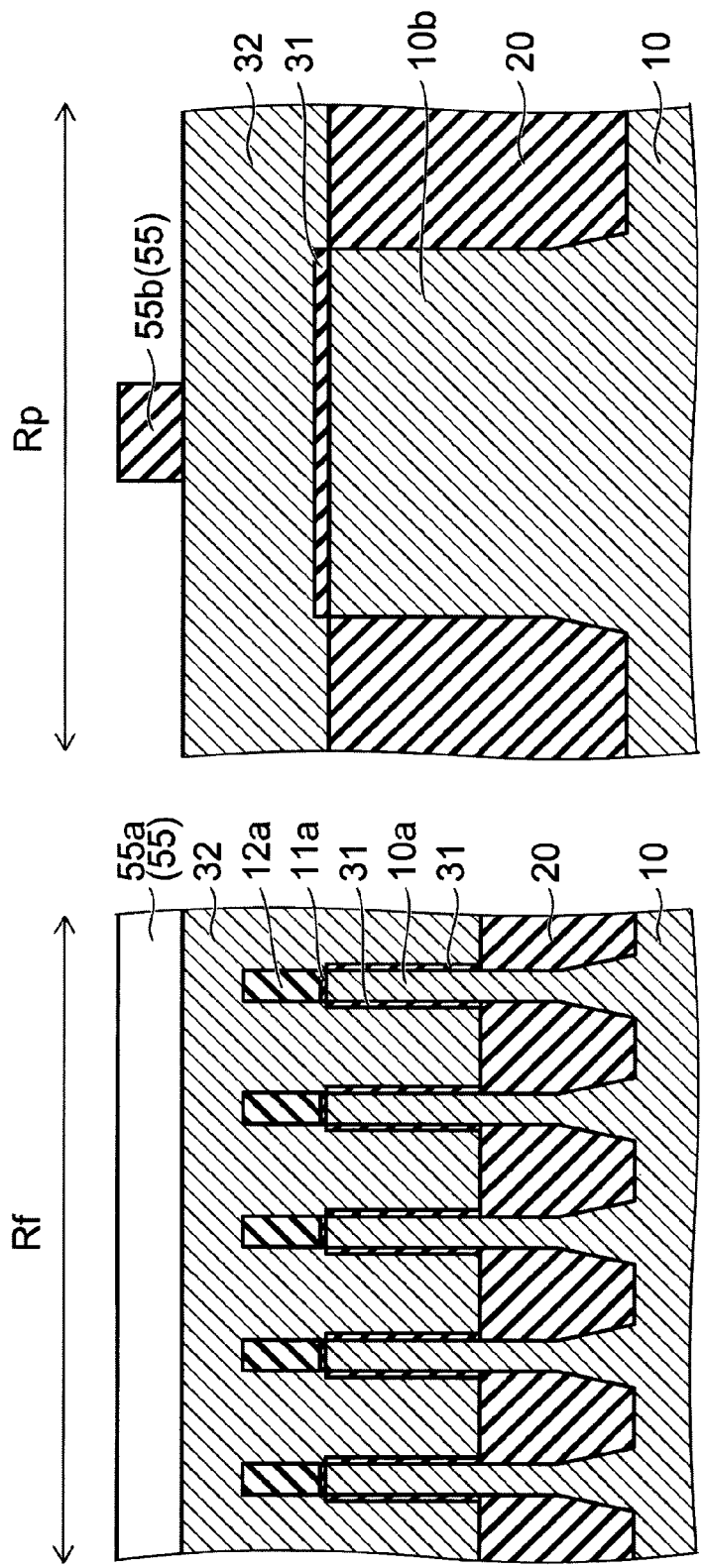

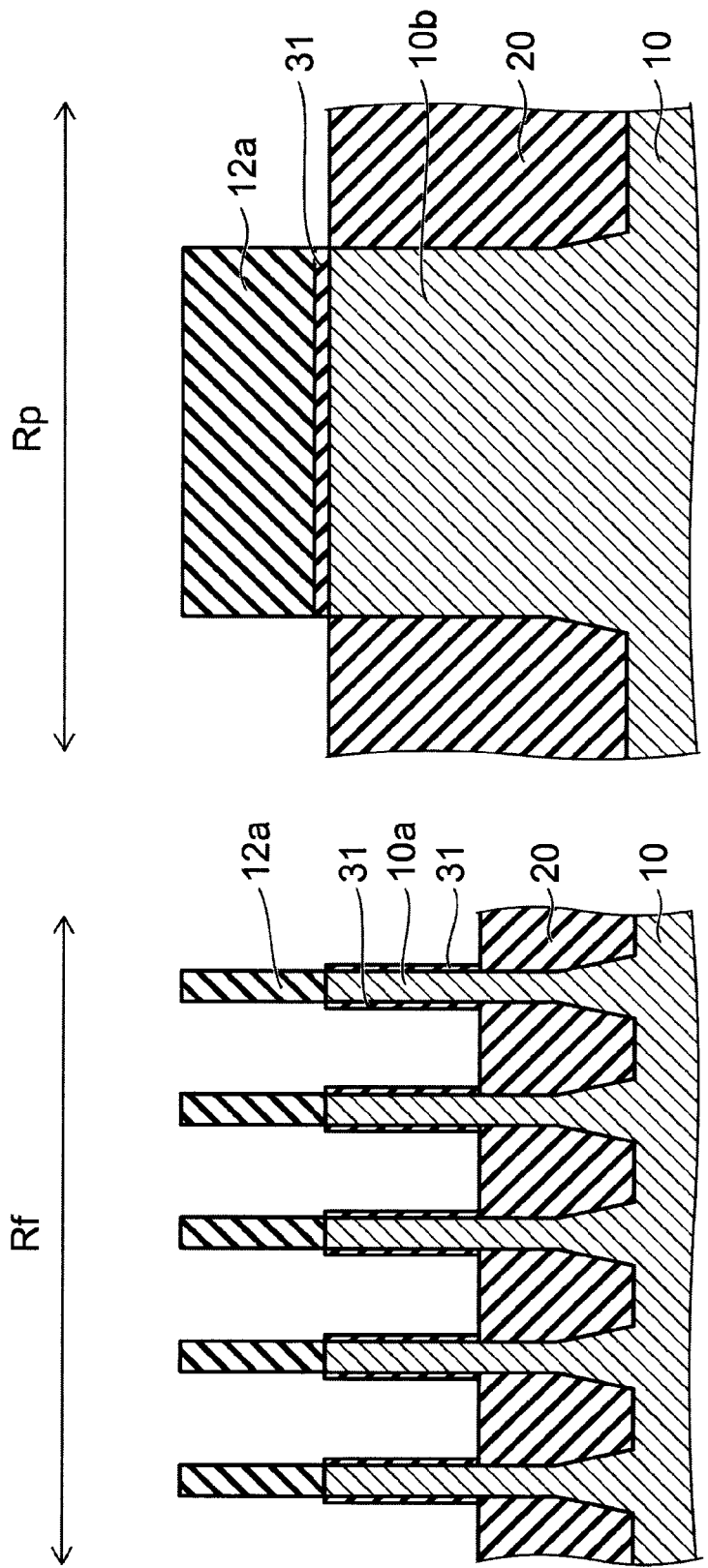

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2012-04795, filed on Mar. 5, 2012; the entire contents of which are incorporated herein by reference.

FIELD

Embodiments described herein relate generally to a manufacturing method of a semiconductor device.

BACKGROUND

In recent years, to achieve both objectives of improving the degree of integration and increasing on-state current of a MOSFET (Metal-Oxide-Semiconductor Field-Effect Transistor), a fin type MOSFET (hereinafter referred to as "fin type transistor") is proposed. In the fin type transistor, a fin, which extends in one direction and has a convex shape, is formed on an upper surface of a semiconductor substrate and a gate electrode extending in another direction is provided to cross over the fin. Thereby a circumferential portion of a portion of the fin surrounded by the gate electrode becomes a channel region, so that the channel width can be increased without increasing an element area.

From a viewpoint of utilizing design resources, there is a need that a fin type transistor and a normal planar MOSFET (hereinafter referred to as "planar transistor") are mixed on the same substrate. However, it is difficult for conventional techniques to separately form a fin type transistor and a planar transistor by a common process.

BRIEF DESCRIPTION OF THE DRAWINGS

FIGS. 1A and 1B to FIGS. 16A and 16B are process cross-sectional views illustrating a manufacturing method of a semiconductor device according to a first embodiment;

FIGS. 17A and 17B are perspective views illustrating the semiconductor device according to the first embodiment, in which FIG. 17A illustrates a fin type transistor area and FIG. 17B illustrates a planar transistor area;

FIGS. 18A and 18B to FIGS. 20A and 20B are process cross-sectional views illustrating a manufacturing method of a semiconductor device according to a first comparative example;

FIGS. 21A and 21B and FIGS. 22A and 22B are process cross-sectional views illustrating a manufacturing method of a semiconductor device according to a second comparative example;

DETAILED DESCRIPTION

In general, according to one embodiment, a manufacturing method of a semiconductor device includes forming a lower mask film on a semiconductor substrate. The method includes forming a barrier film on the lower mask film in a first area without forming the barrier film in a second area. The barrier film is made of a material different from a material of the lower mask film. The method includes forming an upper mask film on the lower mask film and the barrier film. The upper mask film is made of a material different from material of the barrier film. The method includes forming an upper mask member, a barrier member, and a lower mask member respectively by selectively removing the upper mask film, the barrier film, and the lower mask film and forming an active portion by selectively removing an upper layer portion of the semiconductor substrate. The method includes removing the upper mask member and leaving the lower mask member in the first area and removing the upper mask member and the lower mask member in the second area. The removing is performed by etching in a condition in which an etching rate of the upper mask member and an etching rate of the lower mask member are higher than an etching rate of the barrier member while protecting a side surface of the lower mask member. The method includes forming a conductive film so that the conductive film covers the active portion and the lower mask member. And, the method includes selectively removing the conductive film by performing etching in a condition in which an etching rate of the conductive film is higher than the etching rate of the lower mask member.

Hereinafter, embodiments of the invention will be described with reference to the drawings.

First, a first embodiment will be described.

Figure 1A:
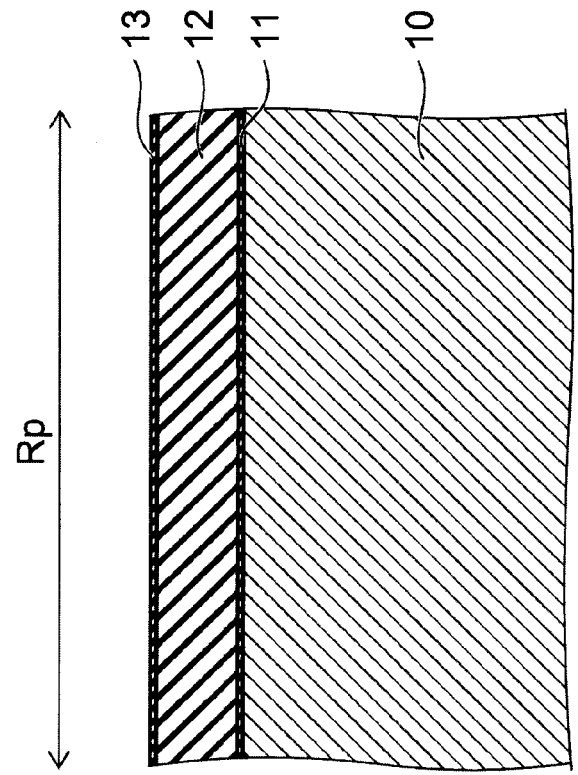

FIGS. 1A to 16B are process cross-sectional views illustrating a manufacturing method of a semiconductor device according to the embodiment. FIGS. 1A, 2A, 3A, . . . , and 16A illustrate a fin type transistor area and FIGS. 1B, 2B, 3B, . . . , and 16B illustrate a planar transistor area. FIGS. 17A and 17B are perspective views illustrating the semiconductor device according to the embodiment, in which FIG. 17A illustrates a fin type transistor area and FIG. 17B illustrates a planar transistor area.

The semiconductor device according to the embodiment is, for example, a storage device, which is, for example, an MRAM (Magneto resistive Random Access Memory). In an MRAM, a plurality of memory cells are arranged in an array form and each memory cell is provided with a magneto-resistive memory device and a transistor. In the embodiment, a transistor included in each memory cell is a fin type transistor described later and a transistor included in a peripheral circuit is a planar transistor described later.

Figure 1B:
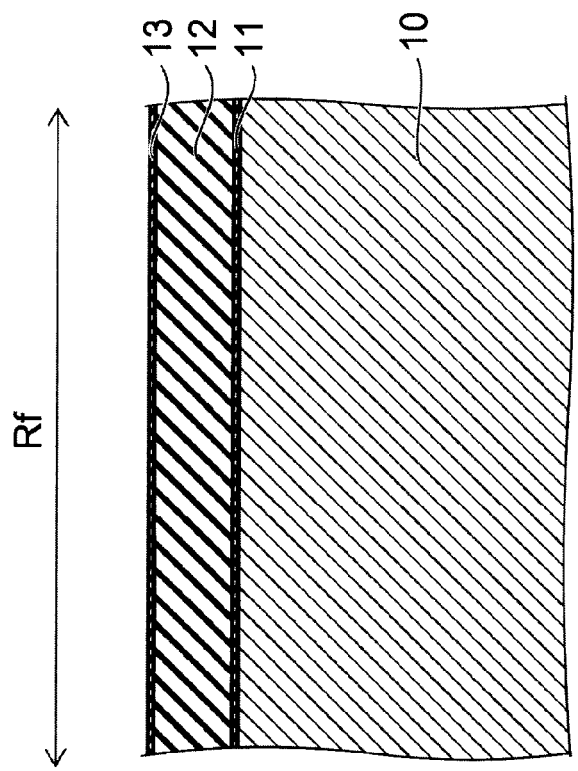
Figure 2A:
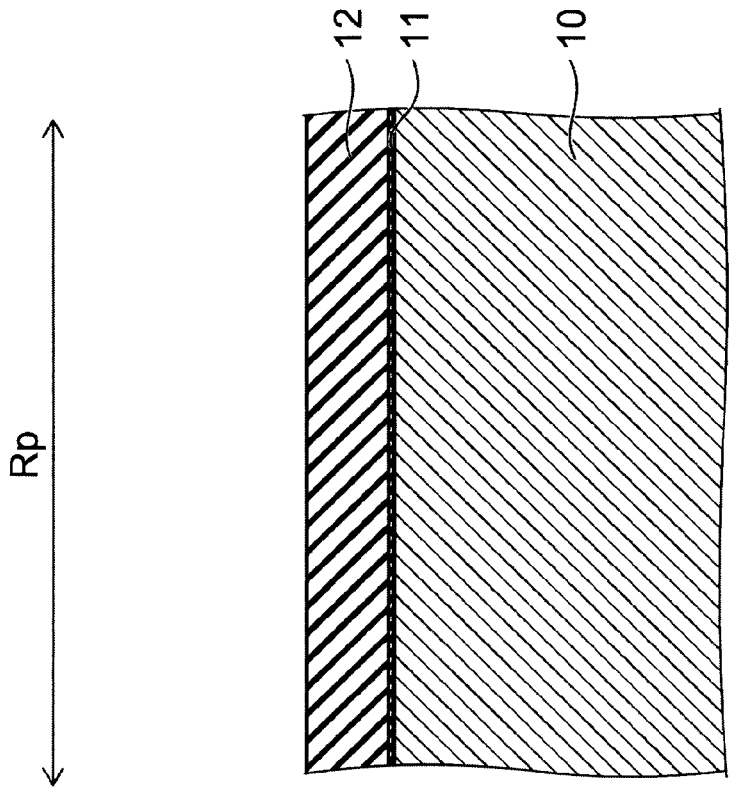

First, as shown in FIGS. 1A and 1B, a silicon substrate 10 is prepared. For example, the silicon substrate 10 is formed of a single-crystal silicon to which impurities are added. For example, the silicon substrate 10 is a part of a silicon wafer. In the silicon substrate 10, a fin type transistor area Rf and a planar transistor area Rp are set. The fin type transistor area Rf is a part of a memory cell area and is an area in which a fin type transistor will be formed. On the other hand, the planar transistor area Rp is a part of a peripheral circuit area and is an area in which a planar transistor will be formed.

In both the area Rf and the area Rp, a silicon oxide film 11 is formed on the upper surface of the silicon substrate 10.

Next, as a lower mask film, for example, a silicon nitride film 12 is formed by an LP-CVD (low pressure chemical vapor deposition) method. Next, a silicon oxide film 13 is formed as a barrier film by oxidizing the upper surface of the silicon nitride film 12. Although the silicon oxide film 13 may be formed by a deposition method, it is favorable to form the silicon oxide film 13 by a plasma oxidation method in order to form a film having a smaller thickness and a lower etching rate. The film thickness of the silicon oxide film 13 is, for example, 5 nm or less.

Figure 2B:
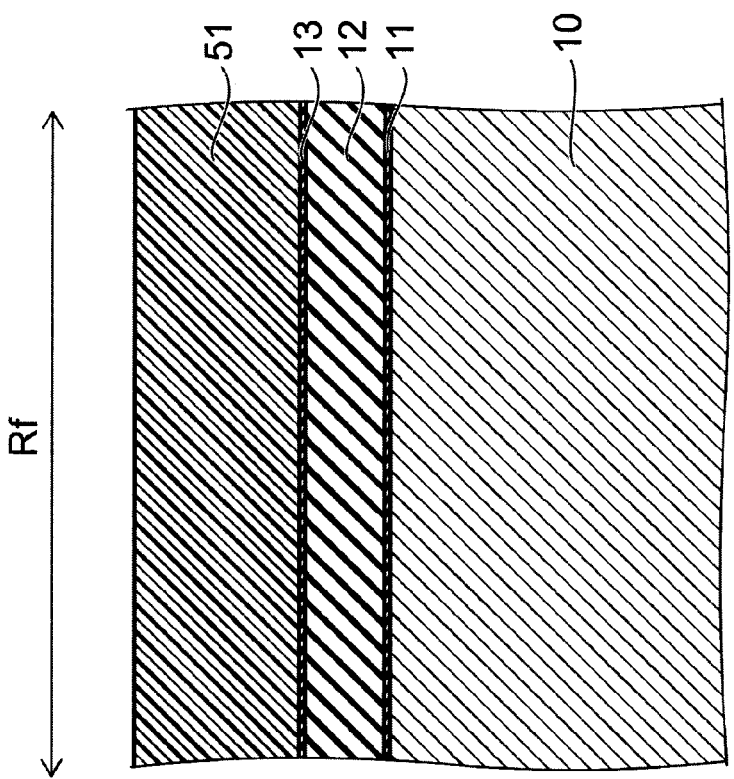

Next, as shown in FIGS. 2A and 2B, a resist mask 51 is formed by a lithography method. The resist mask 51 is formed so that the fin type transistor area Rf is covered by the resist mask 51 and the planar transistor area Rp is exposed. In this state, wet etching is performed and the silicon oxide film 13 is removed from the planar transistor area Rp. At this time, in the fin type transistor area Rf, the silicon oxide film 13 is covered by the resist mask 51, so that the silicon oxide film 13 is not etched and still remains. Thereafter, the resist mask 51 is removed by a wet process.

Figure 3B:
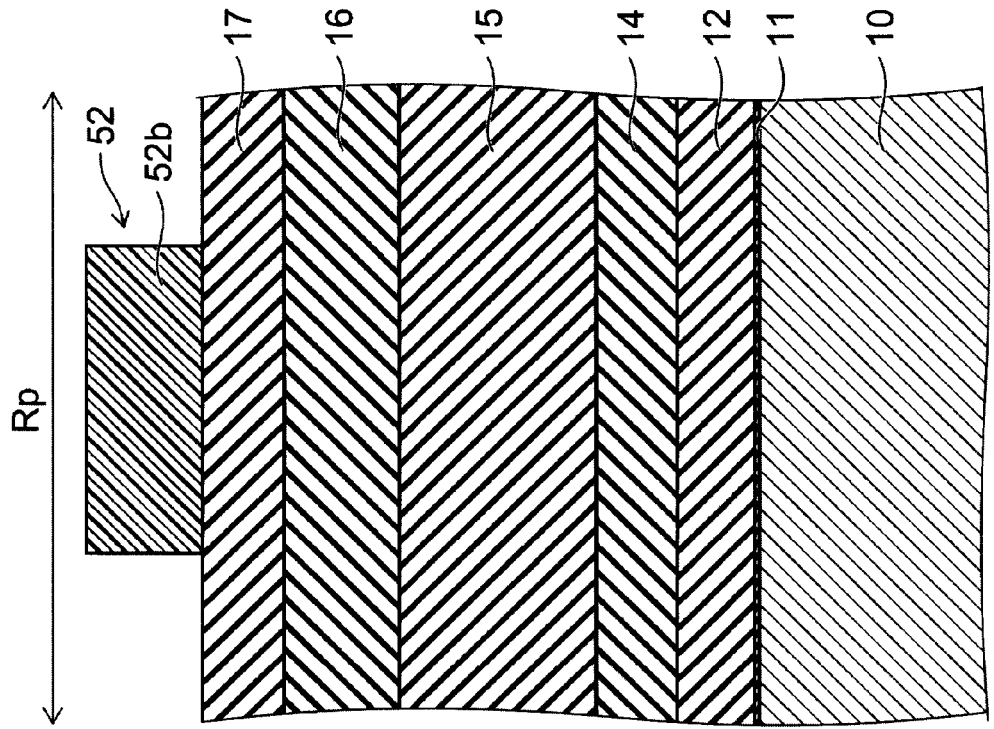
Figure 3A:
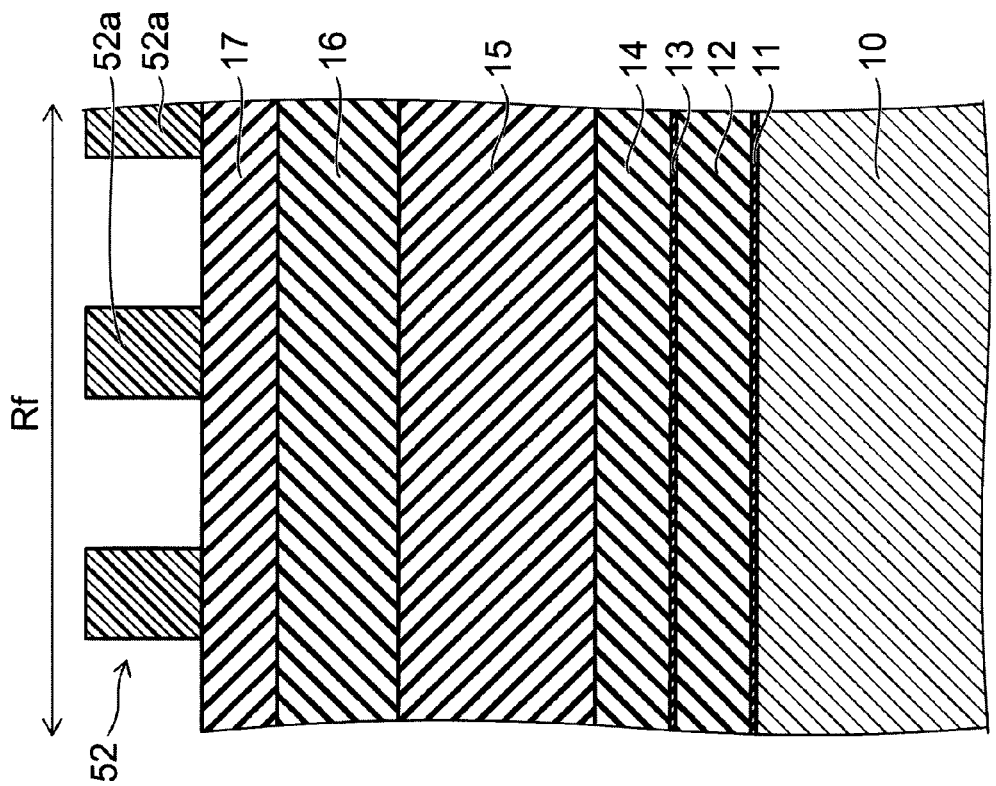

Next, as shown in FIGS. 3A and 3B, as an upper mask film, for example, a silicon nitride film 14 is formed by the LP-CVD method. The silicon nitride film 14 is in contact with the silicon oxide film 13 in the fin type transistor area Rf and is in contact with the silicon nitride film 12 in the planar transistor area Rp.

Next, a film of a hard mask material 15 formed of, for example, silicon oxide, a film of a hard mask material 16 formed of, for example, silicon nitride, and an antireflective film 17 are formed in this order. Next, a resist film is formed on the antireflective film 17 and patterning is performed by the lithography method, so that a resist mask 52 is formed. In the fin type transistor area Rf, a plurality of stripe patterns 52a extending in one direction (hereinafter referred to as "fin direction") are formed in the resist mask 52. On the other hand, in the planar transistor area Rp, a rectangular pattern 52b is formed in the resist mask 52. At this time point, on the upper surface of the antireflective film 17, there is a level difference corresponding to the film thickness of the silicon oxide film 13 at a boundary between the area Rf and area Rp. However, the thickness of the silicon oxide film 13 is thin (for example, 5 nm or less), so that it is possible to ignore the influence of the resist mask 52 affecting the lithography.

Figure 4A:
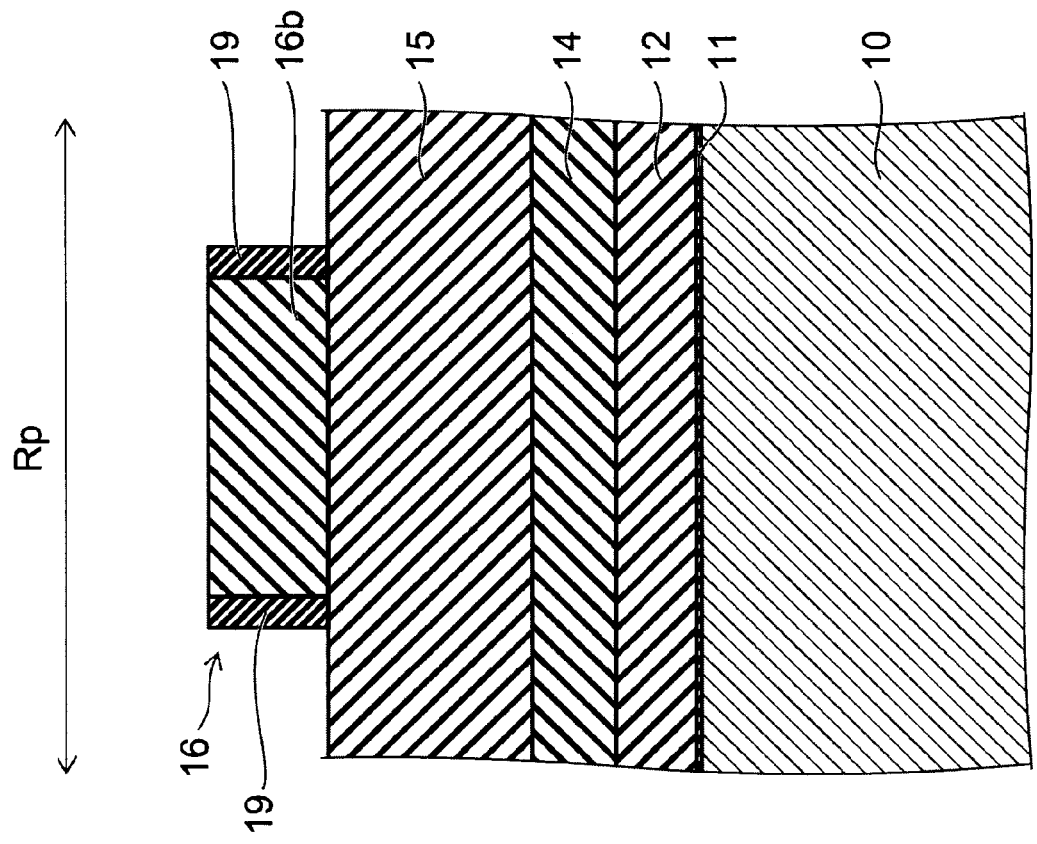
Figure 4B:
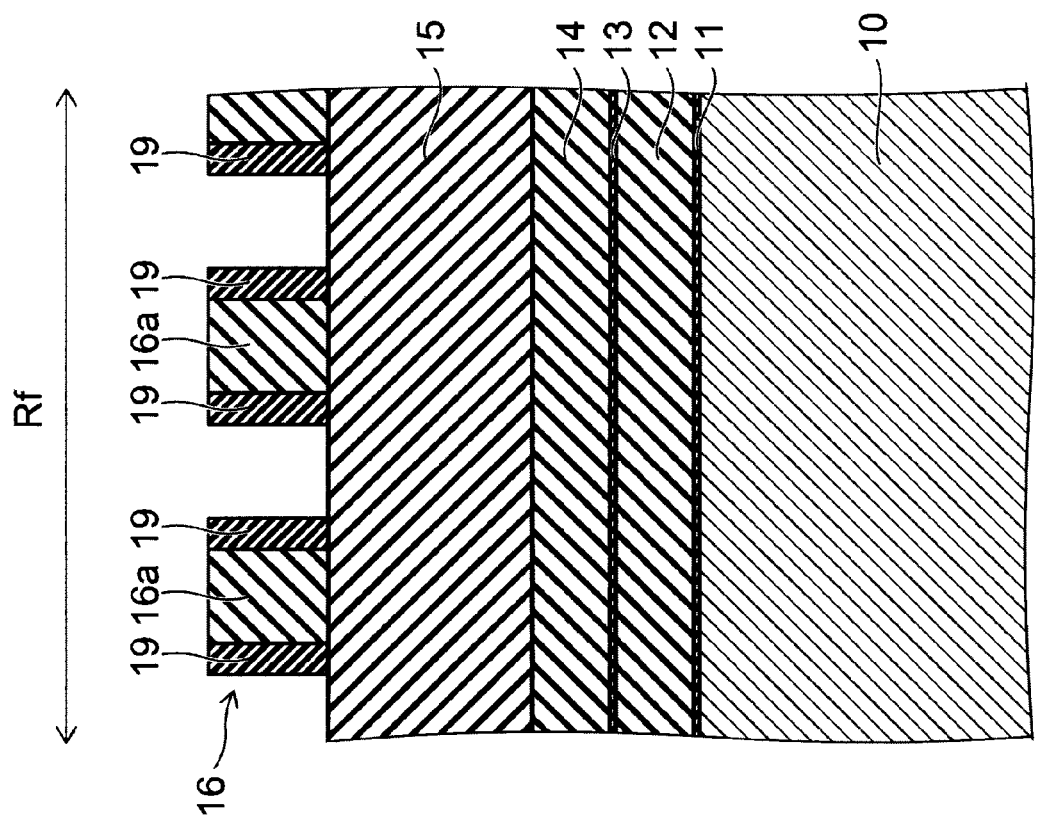

Next, as shown in FIGS. 4A and 4B, the antireflective film 17 and the hard mask material 16 are selectively removed by performing etching such as RIE (Reactive Ion Etching) by using the resist mask 52 as a mask, and the pattern of the resist mask 52 is transferred to the hard mask material 16. Thereby, in the fin type transistor area Rf, stripe patterns 16a extending in the fin direction are formed in the hard mask material 16. On the other hand, in the planar transistor area Rp, a pattern 16b having a rectangular shape as seen from above is formed in the hard mask material 16.

Next, the widths of the patterns 16a and 16b are reduced by performing a slimming process on the patterned hard mask material 16 as needed. Next, for example, an amorphous silicon film is deposited on the entire surface and the entire surface is etched back. Thereby the amorphous silicon film remains only on the side surfaces of the patterns 16a and 16b of the hard mask material 16 and becomes sidewalls 19.

Next, as shown in FIGS. 5A and 5B, a resist mask 53, which covers the planar transistor area Rp and exposes the fin type transistor area Rf, is formed by the lithography method. In this state, wet etching is performed and the hard mask material 16 is removed from the fin type transistor area Rf. At this time, in the planar transistor area Rp, the pattern 16b of the hard mask material 16 is covered by the resist mask 53, so that the pattern 16b is not etched and still remains. Thereafter, the resist mask 53 is removed.

Next, as shown in FIGS. 6A and 6B, etching is performed by using the hard mask material 16 (see FIG. 5B) and the sidewalls 19 (see FIGS. 5A and 5B) as a mask, so that the patterns of the hard mask material 16 and the sidewalls 19 are transferred to the hard mask material 15. Thereby, in the fin type transistor area Rf, the patterns of sidewalls 19 are transferred to the hard mask material 15 and stripe patterns 15a extending in the fin direction are formed. On the other hand, in the planar transistor area Rp, the pattern 16b of the hard mask material 16 and the patterns of the sidewalls 19 formed on the side surfaces of the pattern 16b are transferred to the hard mask material 15 and a pattern 15b having a rectangular shape as seen from above is formed. Thereby the hard mask material 15 becomes a mask for substrate.

Next, as shown in FIGS. 7A and 7B, etching is performed by using the hard mask material 15 (see FIGS. 6A and 6B) as a mask, the silicon nitride film 14, the silicon oxide film 13, the silicon nitride film 12, and the silicon oxide film 11 are selectively removed, and further an upper layer portion of the silicon substrate 10 is selectively removed. Thereby, in the fin type transistor area Rf, the silicon nitride film 14, the silicon oxide film 13, the silicon nitride film 12, the silicon oxide film 11, and the upper layer portion of the silicon substrate 10 are processed into a stripe shape. As a result, the upper layer portion of the silicon substrate 10 becomes fins 10a. On the other hand, in the planar transistor area Rp, the silicon nitride film 14, the silicon nitride film 12, the silicon oxide film 11, and the upper layer portion of the silicon substrate 10 are processed into a rectangular solid shape. As a result, the upper layer portion of the silicon substrate 10 becomes an device area 10b. The fins 10a and the device area 10b are active portions in which a body portion of the transistor is formed.

A remaining portion of the silicon nitride film 14 becomes a silicon nitride member 14a as an upper mask member, a remaining portion of the silicon oxide film 13 becomes a silicon oxide member 13a as a barrier member, a remaining portion of the silicon nitride film 12 becomes a silicon nitride member 12a as a lower mask member, and a remaining portion of the silicon oxide film 11 becomes a silicon oxide member 11a. At this time, there is the silicon oxide member 13a in the fin type transistor area Rf and there is no silicon oxide member 13a in the planar transistor area Rp. However, the thickness of the silicon oxide member 13a is thin (for example, 5 nm or less), so that it is possible to ignore the influence of the silicon oxide member 13a affecting the shapes of the fins 10a and the device area 10b.

Figure 8B:
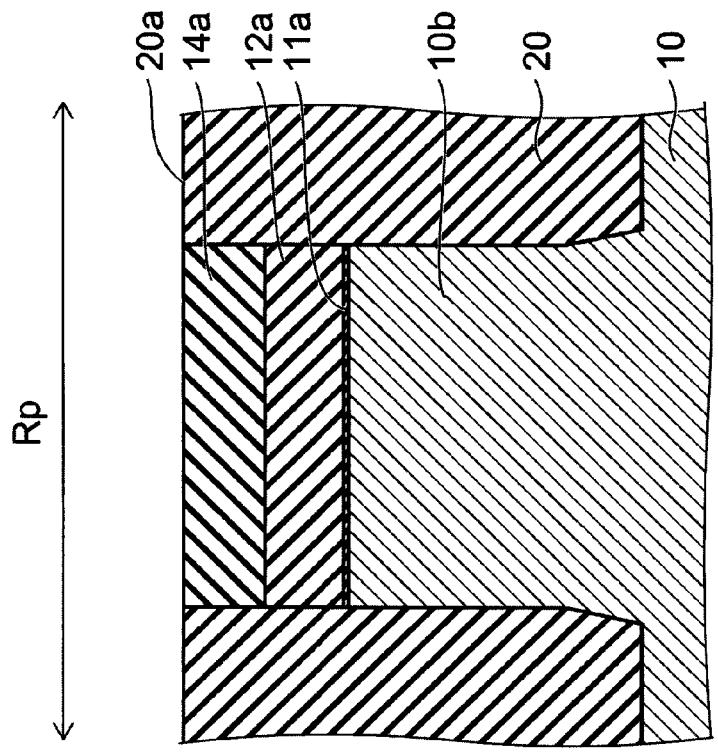
Figure 8A:
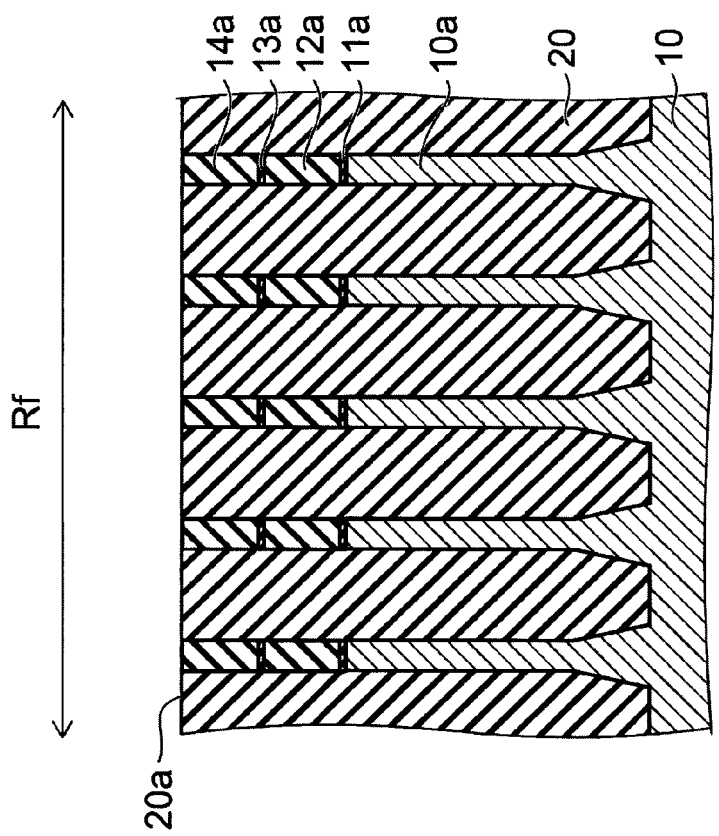

Next, as shown in FIGS. 8A and 8B, silicon oxide is deposited on the entire surface. Next, the upper surface of the deposited silicon oxide is flattened by performing a planarizing process such as CMP (Chemical Mechanical Polishing) by using the silicon nitride member 14a as a stopper material. Thereby a element isolation insulating film 20 is formed to cover the upper surface of the silicon substrate 10. At this time, the height of an upper surface 20a of the element isolation insulating film 20 is substantially the same as the height of the upper surface of the silicon nitride member 14a and the heights are substantially the same between the area Rf and the area Rp.

Figure 9B:
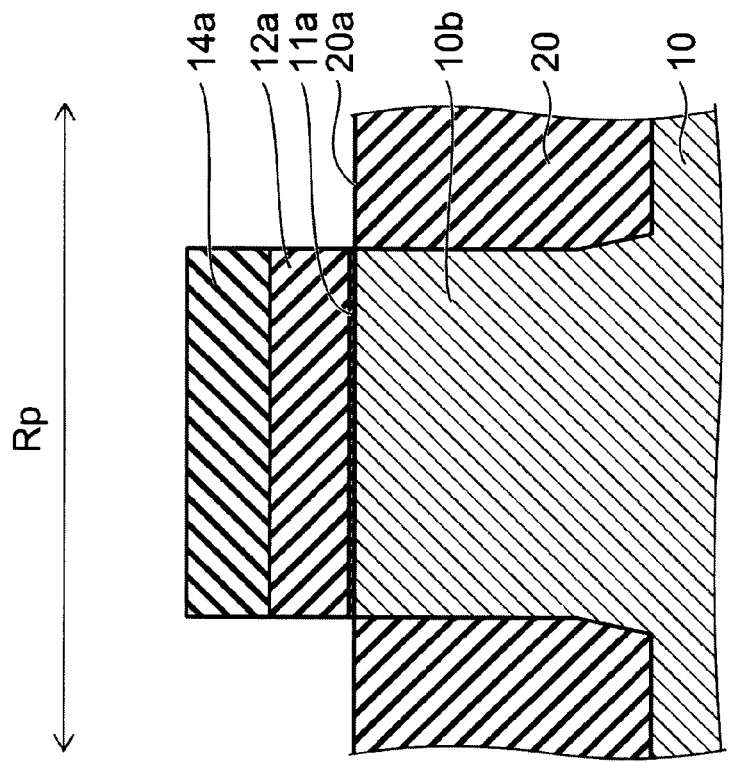
Figure 9A:
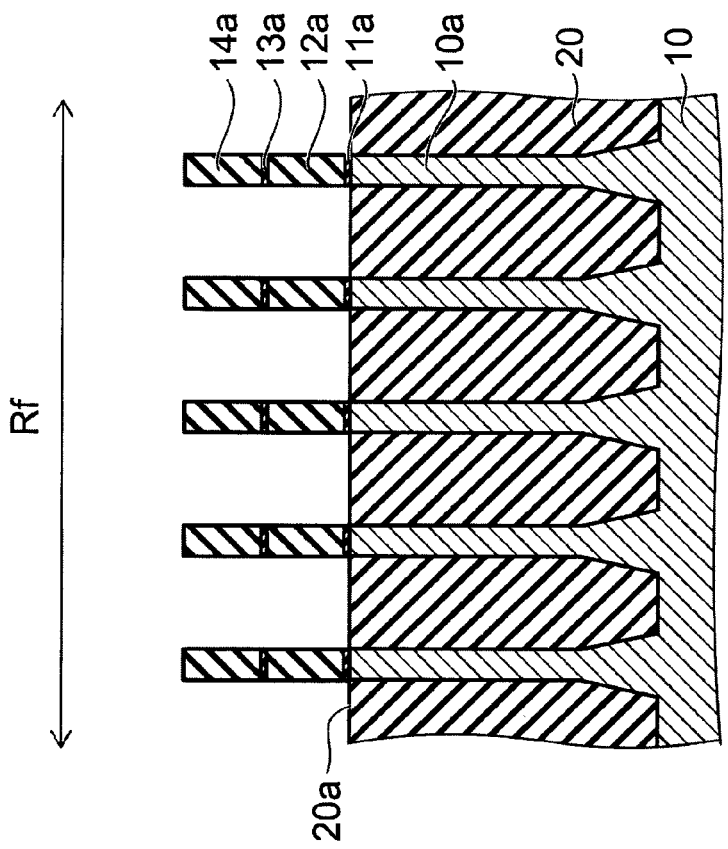

Next, as shown in FIGS. 9A and 9B, wet etching is performed on the element isolation insulating film 20. Thereby the element isolation insulating film 20 is etched back in both the area Rf and the area Rp and the upper surface 20a of the element isolation insulating film 20 is retreated to a position required by the planar transistor to be formed, for example, substantially the same position as that of the silicon oxide member 11a. At this time, the position of the upper surface 20a in the area Rf and the position of the upper surface 20a in the area Rp are substantially the same as each other in the vertical direction. For example, the element isolation insulating film 20 covers the side surfaces of the device area 10b.

Next, as shown in FIGS. 10A and 10B, a resist mask 54 is formed by the lithography method so that the resist mask 54 covers the planar transistor area Rp and exposes the fin type transistor area Rf. The resist mask 54 is formed so that a stacked body made of the silicon oxide member 11a, the silicon nitride member 12a, and the silicon nitride member 14a is buried in the resist mask 54 in the planar transistor area Rp. Next, for example, wet etching is performed by using the resist mask 54 as a mask. Thereby, in the fin type transistor area Rf, the upper surface 20a of the element isolation insulating film 20 is retreated to a position required by the fin type transistor to be formed, for example, a position where a desired channel width can be realized. In this way, the element isolation insulating film 20 buries the lower portions of the fins 10a in the fin type transistor area Rf and covers the side surfaces of the device area 10b in the planar transistor area Rp. Hereinafter, the portion of the fin 10a buried by the element isolation insulating film 20 is referred to as "lower portion" of the fin 10a and the portion of the fin 10a protruding from the element isolation insulating film 20 is referred to as "upper portion" of the fin 10a. At this time point, the upper portion of the fin 10a is exposed.

Next, impurities are ion-implanted as needed. At this time, the impurities are implanted into an upper layer portion of the element isolation insulating film 20 in the fin type transistor area Rf, and the impurities are scattered by the upper layer portion and introduced to the lower portion of the fin 10a. Thereby a punch-through stopper layer (not shown in the drawings) is formed in the lower portion of the fin 10a. At this time, the silicon nitride members 12a and 14a function as a thick mask, so that the impurities are not implanted into the upper surface of the fin 10a. On the other hand, in the planar transistor area Rp, the resist mask 54 functions as a mask, so that the impurities are not implanted into the device area 10b. Thereafter, the resist mask 54 is removed.

Figure 11B:
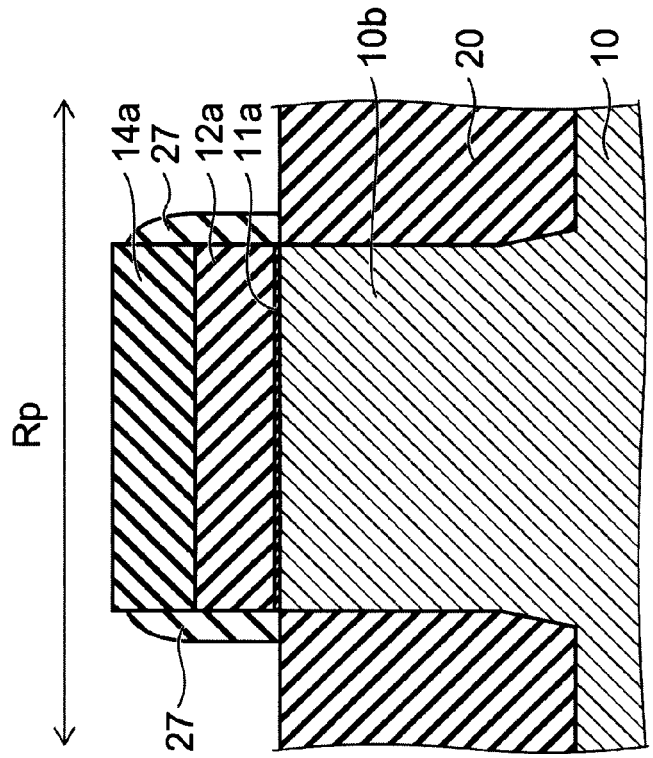
Figure 11A:
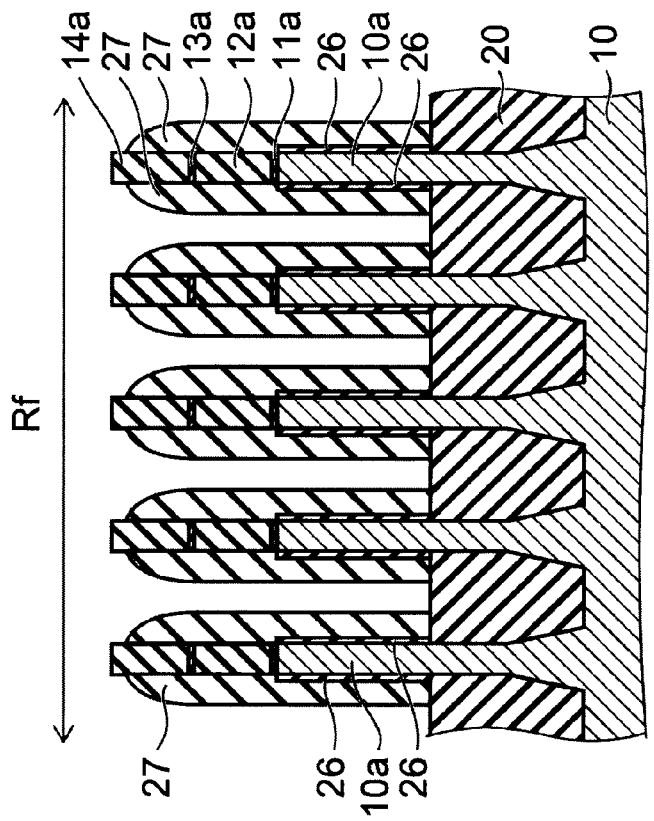

Next, as shown in FIGS. 11A and 11B, a protective film 26 formed of silicon oxide is formed on exposed surfaces of an active portion, that is, the side surfaces of the upper portion of the fin 10a, by performing a thermal oxidation process. The protective film 26 may be formed by a plasma oxidation process or may be formed by depositing silicon oxide. In the case of the plasma oxidation process, the surfaces of the silicon nitride members 12a and 14a are also oxidized.

Next, a sidewall protective film 27 is formed on the entire surface. The material of the sidewall protective film 27 is is different from all of the materials of the silicon nitride member 12a, the silicon oxide member 13a, the silicon nitride member 14a, and the protective film 26. Specifically, the material of the sidewall protective film 27 is selected from materials other than silicon oxide and silicon nitride. For example, the material of the sidewall protective film 27 is non-doped amorphous silicon. Next, the entire surface is etched back, so that portions of the sidewall protective film 27, which are disposed on the silicon nitride member 14a and on the upper surface 20a of the element isolation insulating film 20, are removed and the silicon nitride member 14a is exposed. Thereby, in the fin type transistor area Rf, the sidewall protective film 27 remains on the side surfaces of a stacked body made of the upper portion of the fin 10a, the silicon oxide member 11a, the silicon nitride member 12a, the silicon oxide member 13a, and the silicon nitride member 14a and outside of the protective film 26. On the other hand, in the planar transistor area Rp, the sidewall protective film 27 remains on the side surfaces of a stacked body made of the silicon oxide member 11a, the silicon nitride member 12a, and the silicon nitride member 14a.

Figures 12A, 12B:
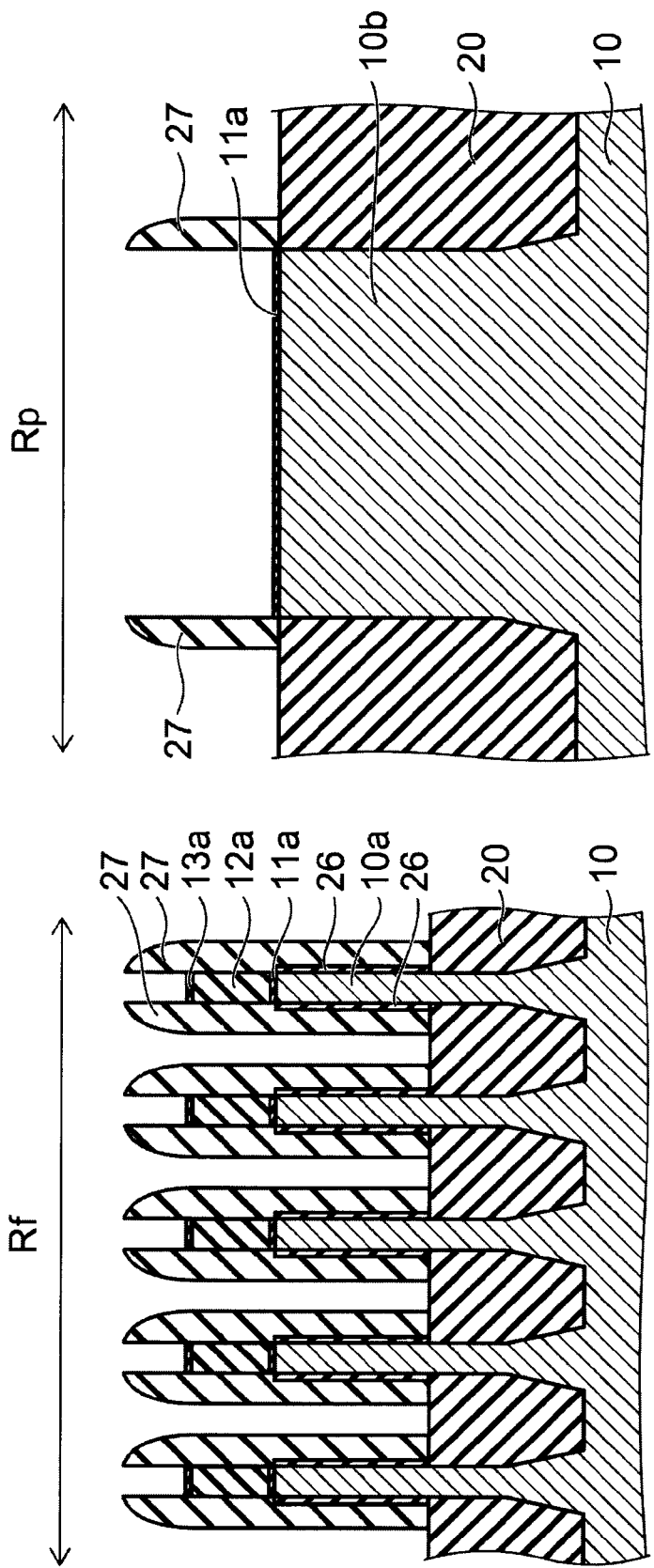

Next, as shown in FIGS. 12A and 12B, wet etching using, for example, phosphoric acid ($H_3PO_4$) as an etching solution is performed. Thereby, in the fin type transistor area Rf, the silicon nitride member 14a is removed. At this time, the side surfaces of the silicon nitride member 12a are protected by the sidewall protective film 27 and the upper surface of the silicon nitride member 12a is protected by the silicon oxide member 13a, so that the silicon nitride member 12a is not etched and still remains. On the other hand, in the planar transistor area Rp, the silicon oxide member 13a is not provided and the silicon nitride member 12a is in contact with the silicon nitride member 14a, so that both the silicon nitride member 12a and the silicon nitride member 14a are etched and removed. At this time, the upper surface of the device area 10b is covered by the silicon oxide member 11a, so that when the silicon nitride members 14a and 12a are etched, the upper surface of the device area 10b is prevented from being etched or damaged.

Next, as shown in FIGS. 13A and 13B, the sidewall protective film 27 (see FIGS. 12A and 12B) is removed by, for example, wet etching using an alkaline etching solution. At this time, in the fin type transistor area Rf, the fin 10a is not etched because the lower portion of the fin 10a is protected by the element isolation insulating film 20, the side surfaces of the upper portion are protected by the protective film 26, and the upper surface of the upper portion is protected by the silicon oxide member 11a, the silicon nitride member 12a, and the silicon oxide member 13a. On the other hand, in the planar transistor area Rp, the device area 10b is not etched because the side surfaces of the device area 10b are protected by the element isolation insulating film 20 and the upper surface of the device area 10b is protected by the silicon oxide member 11a.

Next, as shown in FIGS. 14A and 14B, for example, wet etching using an etching solution including hydrofluoric acid (HF) is performed. Thereby, in the fin type transistor area Rf, the silicon oxide member 13a (see FIGS. 13A and 13B) and the protective film 26 (see FIGS. 13A and 13B) are removed and the silicon oxide member 11a and the silicon nitride member 12a remain on the fin 10a. On the other hand, in the planar transistor area Rp, the silicon oxide member 11a is removed and the upper surface of the device area 10b is exposed.

Next, as shown in FIGS. 15A and 15B, for example, a thermal oxidation process is performed and a gate insulating film 31 formed of, for example, silicon oxide is formed on the exposed surface of the active portion of the silicon substrate 10, that is, the side surfaces of the upper portion of the fin 10a and the upper surface of the device area 10b. At this time, the film thicknesses of the gate insulating film 31 in the fin type transistor area Rf and the planar transistor area Rp may be different from each other. For example, high temperature or long time heat treatment is performed to form a thick silicon oxide film on the entire surface, thereafter the thick silicon oxide film is removed in the fin type transistor area Rf, and then low temperature or short time heat treatment may be performed. Thereby, in the fin type transistor area Rf, a thin silicon oxide film is formed, and in the planar transistor area Rp, a thick silicon oxide film is further thickened.

Next, a conductive film 32 formed of, for example, polysilicon to which impurities are added is formed on the element isolation insulating film 20. In the fin type transistor area Rf, the conductive film 32 covers the upper portion of the fin 10a, the silicon oxide member 11a, the silicon nitride member 12a, and the gate insulating film 31. On the other hand, in the planar transistor area Rp, the conductive film 32 covers the gate insulating film 31.

Next, a mask for conductive film 55 is formed on the conductive film 32 by, for example, a sidewall method. In the fin type transistor area Rf, a plurality of stripe patterns 55a, which extend in a direction crossing the fin direction, for example, a direction perpendicular to the fin direction (hereinafter referred to as "gate direction"), are formed in the mask for conductive film 55. On the other hand, in the planar transistor area Rp, a strip-shaped pattern 55b passing immediately above the center of the device area 10b is formed in the mask for conductive film 55. In other words, the pattern of the mask for conductive film 55 is formed to traverse an area immediately above the active portion.

Figure 16B:
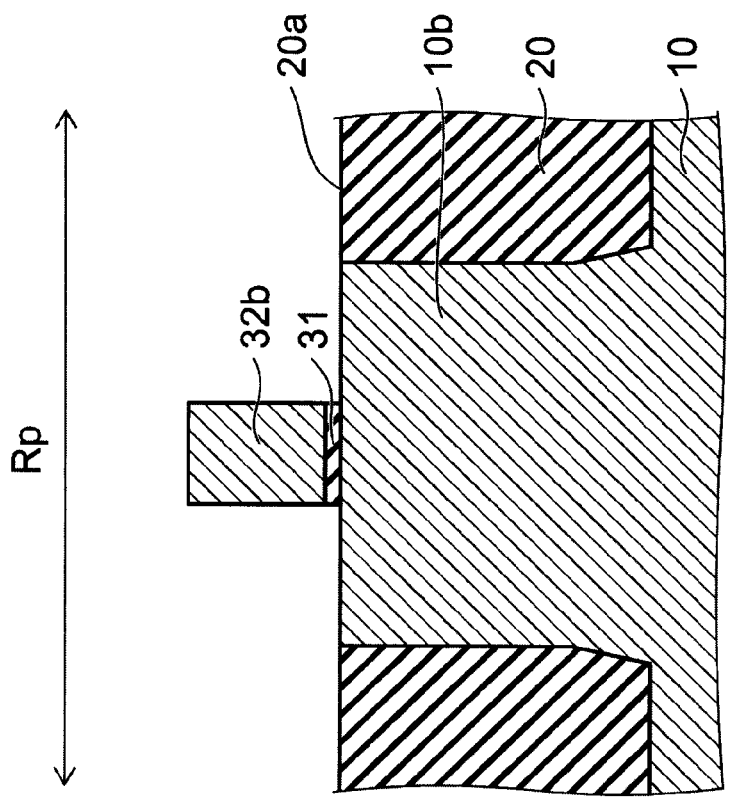
Figure 16A:
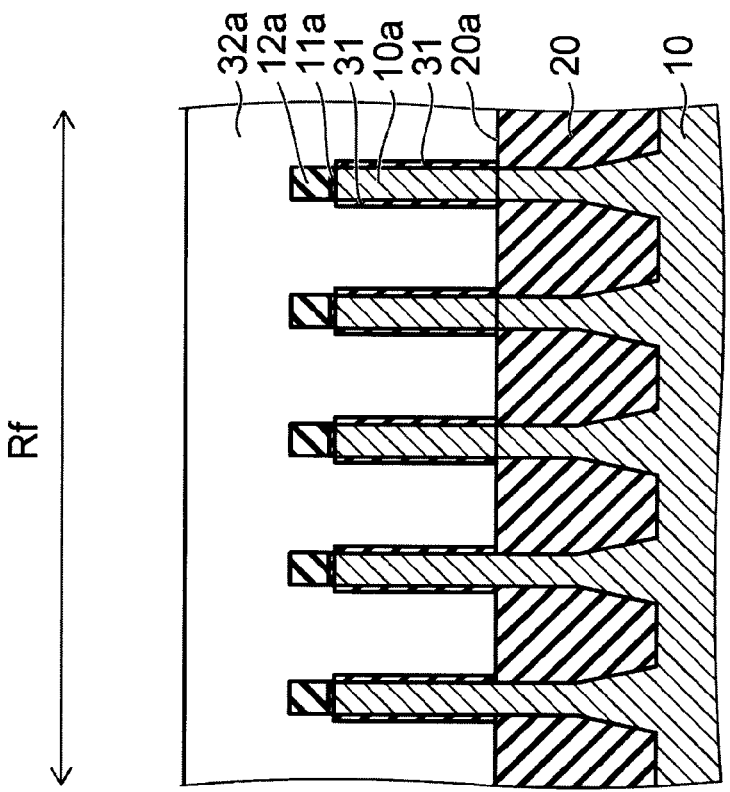
Figures 17A, 17B:
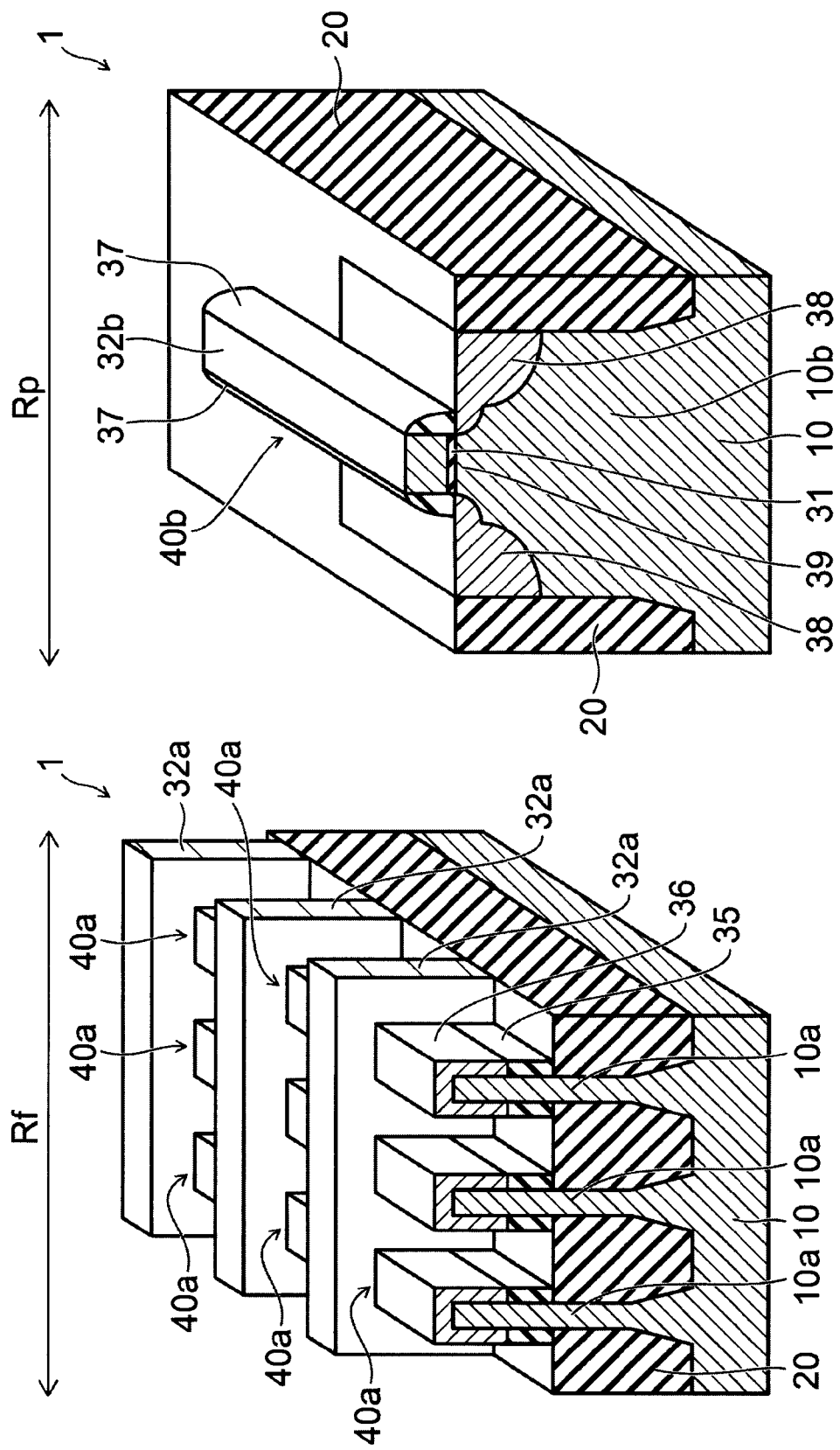

Next, as shown in FIGS. 16A and 16B, etching is performed by using the mask for conductive film 55 (see FIGS. 15A and 15B) as a mask in a condition in which the etching rate of the mask for conductive film 55 is higher than that of the silicon nitride member 12a. Thereby the conductive film 32 is selectively removed. As a result, in the fin type transistor area Rf, the shape of the pattern 55a (see FIG. 15A) is transferred to the conductive film 32 and a plurality of gate electrodes 32a, which extend in the gate direction and cross over the fin 10a, are formed. When the process of the gate electrode 32a is completed, the silicon nitride member 12a and the silicon oxide member 11a may remain or may disappear. FIG. 16A shows a case in which the silicon nitride member 12a and the silicon oxide member 11a remain. The most part of the gate insulating film 31 formed on the side surfaces of the fin 10a remains.

On the other hand, in the planar transistor area Rp, the shape of the pattern 55b (see FIG. 15B) is transferred to the conductive film 32 and a strip-shaped gate electrode 32b passing immediately above the center of the device area 10b is formed. In the gate insulating film 31 formed on the upper surface of the device area 10b, an area covered by the gate electrode 32b remains. In the gate insulating film 31, an area not covered by the gate electrode 32b may remain or may disappear.

At this time, the upper surface 20a of the element isolation insulating film 20 in the fin type transistor area Rf is located lower than the upper surface 20a in the planar transistor area Rp and the gate electrode 32b is formed above the device area 10b, while the gate electrode 32a is formed to cross over the fin 10a. Therefore, the aspect ratio of the gate electrode 32a is higher than that of the gate electrode 32b. Thus, the fin 10a is exposed to the etching for a long time. However, the fin 10a is protected by the silicon nitride member 12a, so that the fin 10a is not etched.

Next, as shown in FIGS. 17A and 17B, an insulating film is formed and the insulating film is etched back by anisotropic etching such as RIE, so that, in the fin type transistor area Rf, insulating sidewalls 35 are formed on side surfaces of the lower portion of the fin 10a which is not covered by the element isolation insulating film 20 and the gate electrode 32a. Even when the silicon nitride member 12a remains in the process shown in FIGS. 16A and 16B, the silicon nitride member 12a is removed by the anisotropic etching process. Next, the silicon oxide member 11a and the gate insulating film 31 are removed from a surface of a portion of the fin 10a which is not covered by the gate electrode 32a. Next, on the exposed surface of the fin 10a, that is, on a surface of a portion of the fin 10a which is not covered by the element isolation insulating film 20, the gate electrode 32a, and the sidewalls 35, an epitaxial layer 36 is formed by epitaxial growth of silicon. At this time, the epitaxial layer 36 is insulated from the gate electrode 32a.

In the planar transistor area Rp, impurities are implanted by using the gate electrode 32b as a mask, sidewalls 37 are formed on both side surfaces of the gate electrode 32b, and impurities are further implanted by using the gate electrode 32b and the sidewalls 37 as a mask, so that a source/drain region 38 is formed on both sides of an area immediately below the gate electrode 32a in the device area 10b. At this time, a portion between the source/drain regions 38 in the device area 10b becomes a channel region 39. In the same manner as in the fin type transistor area Rf, the epitaxial layer 36 may be formed on the source/drain region 38, or need not be formed. FIG. 17B shows an example in which the epitaxial layer 36 is not formed. Thereafter, on the entire surface, an interlayer insulating film (not shown in the drawings), a contact (not shown in the drawings), upper interconnection (not shown in the drawings), and the like are formed. In this way, the semiconductor device 1 according to the embodiment is manufactured.

As shown in FIG. 17A, in the fin type transistor area Rf of the semiconductor device 1, a plurality of fins 10a extending in the fin direction are formed in an upper layer portion of the silicon substrate 10, a plurality of gate electrodes 32a extending in the gate direction are formed so that the gate electrodes 32a cross over the fins 10a, and the gate insulating film 31 (see FIG. 15A) is disposed between the fin 10a and the gate electrode 32a. The lower portion of the fin 10a is buried in the element isolation insulating film 20. A portion of the upper portion of the fin 10a which is covered by the gate electrode 32a becomes a channel region (not shown in the drawings). The epitaxial layer 36 is formed on a surface of a portion of the upper portion of the fin 10a which is not covered by the gate electrode 32a. The portion of the upper portion of the fin 10a which is not covered by the gate electrode 32a and the epitaxial layer 36 become the source/drain region. By this configuration, a fin type transistor 40a is formed for each portion where the fin 10a and the gate electrode 32a intersect each other.

On the other hand, as shown in FIG. 17B, in the planar transistor area Rp, the device area 10b having a rectangular solid shape is formed in an upper layer portion of the silicon substrate 10, for example and the element isolation insulating film 20 is buried around the device area 10b. The gate insulating film 31 is provided on the upper surface of the device area 10b and the gate electrode 32b is provided on the gate insulating film 31 so that the gate electrode 32b traverses an area immediately above the device area 10b. The sidewall 37 is provided on both side surfaces of the gate electrode 32b. Further, the channel region 39 is formed in a portion corresponding to the area immediately below the gate electrode 32b in the device area 10b and the source/drain region 38 is formed on both sides of the channel region 39. By this configuration, a planar transistor 40b is formed.

Next, functions and effects of the embodiment will be described.

In the embodiment, in the process shown in FIGS. 1A and 1B, the silicon nitride film 12 and the silicon oxide film 13 are formed on the silicon substrate 10, and in the process shown in FIGS. 2A and 2B, the silicon oxide film 13 is removed from the planar transistor area Rp. Then, in the process shown in FIGS. 3A and 3B, the silicon nitride film 14, the hard mask material 15, the hard mask material 16, and the antireflective film 17 are laminated in both the areas Rf and Rp. Thereby, when the resist mask 52 is formed, the height of the foundation layer is substantially the same between the area Rf and the area Rp. Therefore, highly accurate lithography can be performed. As a result, it is possible to form a fine pattern in the resist mask 52 and achieve high integration of the semiconductor device 1.

In the process shown in FIGS. 8A and 8B, the silicon nitride members 12a and 14a are provided in both the area Rf and the area Rp, so that, when the CMP is performed on the upper surface 20a of the element isolation insulating film 20, the height of the upper surface 20a can be substantially the same between the area Rf and the area Rp. Thereby, the subsequent processes can be easily performed.

Further, the silicon oxide member 13a is provided only in the fin type transistor area Rf, so that, in the process shown in FIGS. 12A and 12B, when the silicon nitride member 14a is etched, the silicon nitride member 12a is not removed in the fin type transistor area Rf and the silicon nitride member 12a is removed in the planar transistor area Rp. In this way, the silicon nitride member 12a can be left only in the fin type transistor area Rf. Thereby, in the process shown in FIGS. 16A and 16B, when the conductive film 32 is etched and the gate electrodes 32a and 32b are formed, the gate electrode 32a can be formed while the fin 10a is protected from etching by the silicon nitride member 12a in the fin type transistor area Rf and the gate electrode 32b can be formed so that the gate electrode 32b is in contact with the gate insulating film 31 in the planar transistor area Rp. In this way, the fin type transistor 40a can be formed in the fin type transistor area Rf and the planar transistor 40b can be formed in the planar transistor area Rp. In other words, the fin type transistor and the planar transistor can be separately manufactured by using a common process.

In the embodiment, in the fin type transistor area Rf, as shown in FIG. 1A to FIG. 3A, the silicon nitride film 12 and the silicon nitride film 14 are formed on the silicon substrate 10, and in the process shown in FIG. 12A, only the silicon nitride member 14a is removed. Thereby, in the process shown in FIG. 10A, a thick mask member is realized when impurities are ion-implanted to form a punch-through stopper layer, so that it is possible to prevent impurities from being implanted into the upper surface of the fin 10a. Thereby, it is possible to prevent the impurities for forming the punch-through stopper layer from being mixed into the channel region of the fin type transistor 40a.

On the other hand, in the process shown in FIG. 15A to FIG. 16A, when the conductive film 32 is etched and the gate electrode 32a is formed, a thin mask member is realized by using only the silicon nitride member 12a. Thereby, it is possible to realize a mask member which is not thick enough to divide the conductive film 32 and which is thick enough to protect the fin 10a with the silicon oxide member 11a until the process of the gate electrode 32a is completed. As a result, it is possible to form the gate electrode 32a extending in the gate direction and prevent the fin 10a from being damaged.

In the embodiment, the film thickness of the silicon nitride film 12 formed in the process shown in FIG. 1A is set to a film thickness where the silicon nitride member 12a disappears before the epitaxial layer 36 is formed in the process shown in FIG. 17A. Specifically, the silicon nitride member 12a is removed in the etching process for forming the gate electrode 32a or in the etching process for forming the sidewalls 35. Thereby, even if a process for removing the silicon nitride member 12a is not provided after the process of the gate electrode 32a is completed, it is possible to prevent the silicon nitride member 12a from interfering with the formation of the epitaxial layer 36.

As described above, in the embodiment, two layers of the silicon nitride members 12a and 14a are provided, so that, in a series of subsequent processes, it is possible to realize a mask member whose film thickness is "high" required in the ion-implanting process, a mask member whose film thickness is "intermediate" required in the etching process, and a state in which there is "no" mask member which is required in the formation process of the epitaxial layer at an appropriate timing.

Further, in the embodiment, in the process shown in FIG. 12A, the silicon oxide member 13a covers the upper surface of the silicon nitride member 12a formed in the fin type transistor area Rf and the sidewall protective film 27 formed of silicon covers the side surfaces of the silicon nitride member 12a, and thereafter wet etching is performed to remove the silicon nitride member 14a. Thereby, in the fin type transistor area Rf, while the silicon nitride member 12a is protected, only the silicon nitride member 14a can be removed.

Also, in the process shown in FIGS. 13A and 13B, the silicon oxide member 11a covers the upper surface of the fin 10a and the upper surface of the device area 10b and the protective film 26 covers the side surfaces of the fin 10a, and thereafter the sidewall protective film 27 is removed by wet etching. Thereby, while the fin 10a and the device area 10b are protected, the sidewall protective film 27 can be removed.

The materials included in the semiconductor device and the formation method of the materials are not limited to the example described above. Although, in the embodiment, an example in which the semiconductor device 1 is an MRAM is described, it is not limited to this, and the semiconductor device 1 may be any semiconductor device which includes a fin type transistor. In particular, the embodiment is suitable for a fin type transistor having a high aspect ratio. The fin type transistor can be preferably used in a storage device where the integration degree of the memory cells is high and a large current is required.

Next, comparative examples will be described.

First, a first comparative example will be described.

Figure 18A:
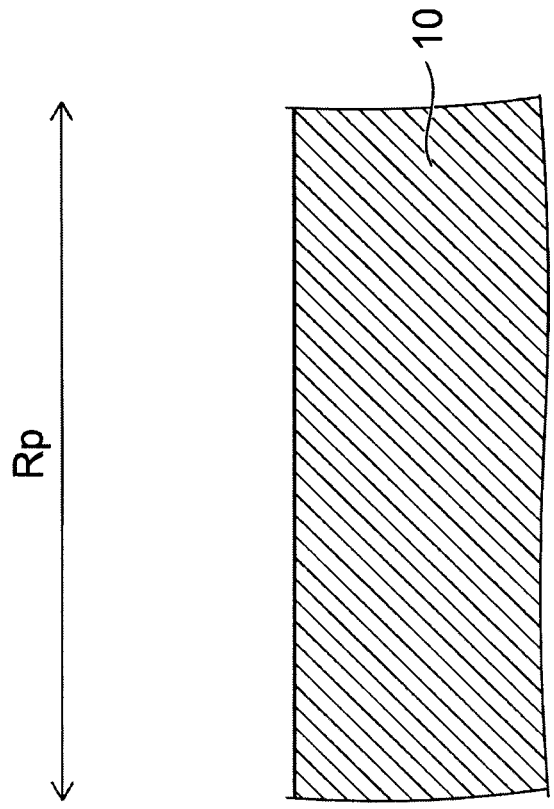
Figure 18B:
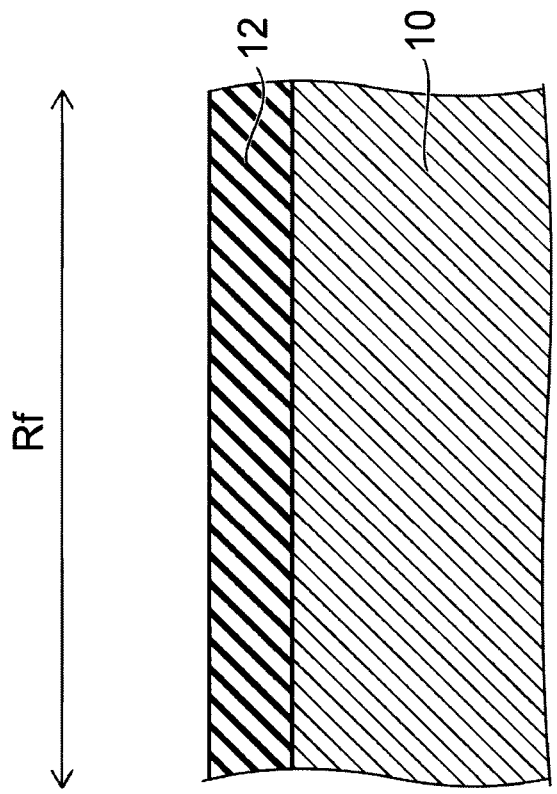
Figure 19B:
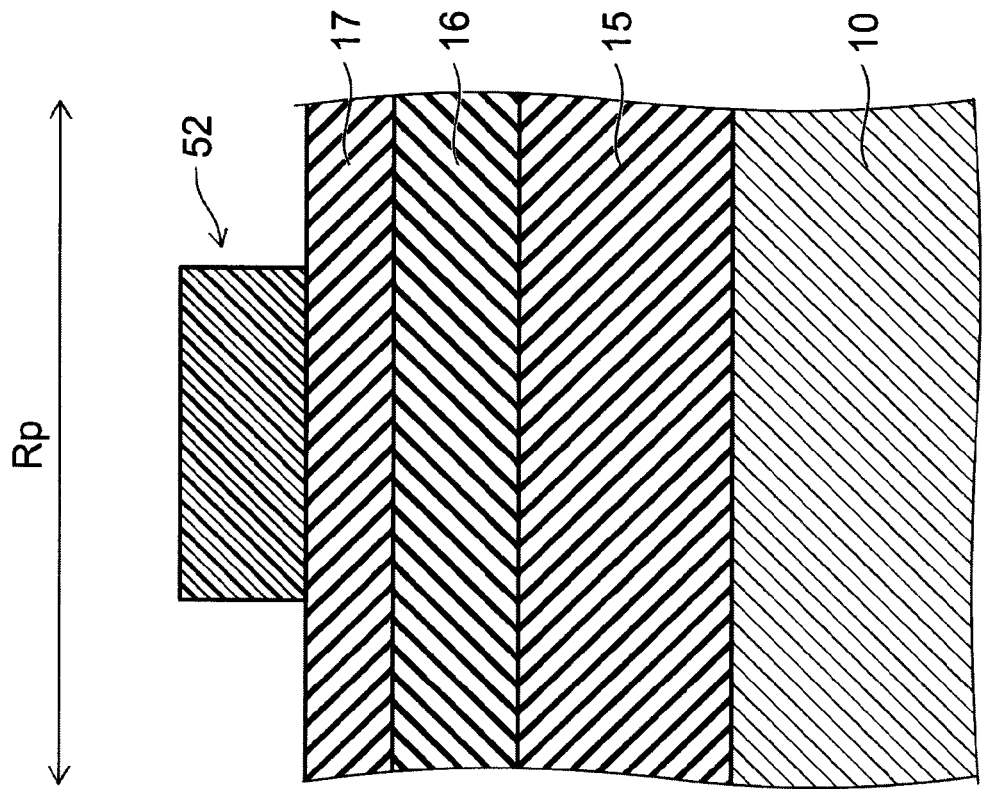
Figure 19A:
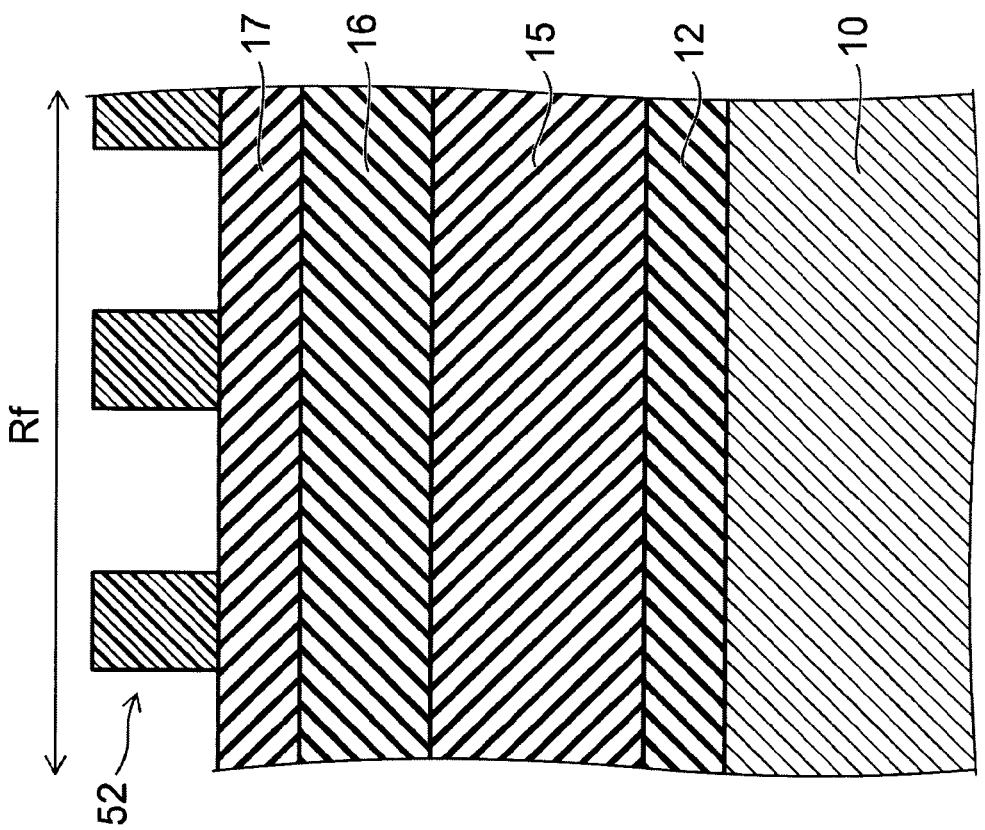
Figures 20A, 20B:
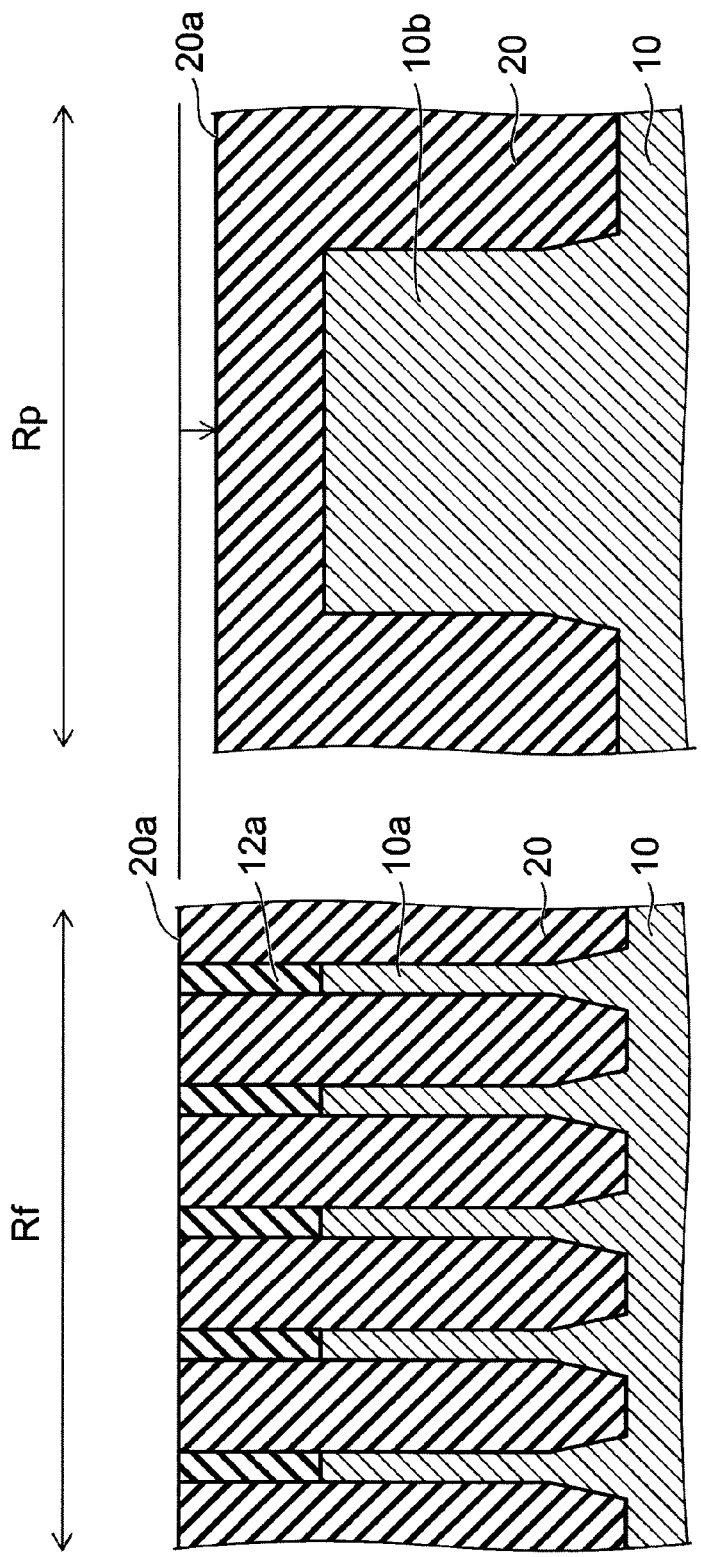

FIGS. 18A and 18B to FIGS. 20A and 20B are process cross-sectional views illustrating a manufacturing method of a semiconductor device according to the comparative example. FIGS. 18A, 19A, and 20A illustrate the fin type transistor area and FIGS. 18B, 19B, and 20B illustrate the planar transistor area.

As described above, in the fin type transistor area Rf, as shown in FIG. 16A, when the conductive film 32 is etched and the gate electrode 32a is formed, the silicon nitride member 12a is required to protect the fin 10a. On the other hand, in the planar transistor area Rp, the silicon nitride member 12a is not required.

Therefore, in the comparative example, as shown in FIGS. 18A and 18B, the silicon nitride film 12 is formed only in the fin type transistor area Rf and the silicon nitride film 12 is not formed in the planar transistor area Rp. In both the area Rf and the area Rp, the silicon nitride film 14 is not formed.

However, in this case, as shown in FIGS. 19A and 19B, when the hard mask material 15, the hard mask material 16, and the antireflective film 17 are formed and the resist mask 52 is formed on the antireflective film 17, the height of the foundation layer of the resist mask 52 is different between the area Rf and the area Rp by the film thickness of the silicon nitride film 12. Therefore, it is not possible to form a fine pattern in the resist mask 52, so that it is not possible to manufacture a highly integrated semiconductor device.

Also, as shown in FIGS. 20A and 20B, when the element isolation insulating film 20 is formed and the CMP is performed on the upper surface 20a of the element isolation insulating film 20, the silicon nitride member 12a becomes a stopper in the fin type transistor area Rf, while there is no stopper in the planar transistor area Rp. Therefore, the position of the upper surface 20a in the planar transistor area Rp is lower than that of the upper surface 20a in the fin type transistor area Rf. Thereby, in the subsequent lithography process, for example, in the process for forming the mask for conductive film 55 shown in FIGS. 15A and 15B, it is not possible to form a fine pattern. In this way, according to the comparative example, it is difficult to manufacture a highly integrated semiconductor device.

Next, a second comparative example will be described.

Figure 21B:
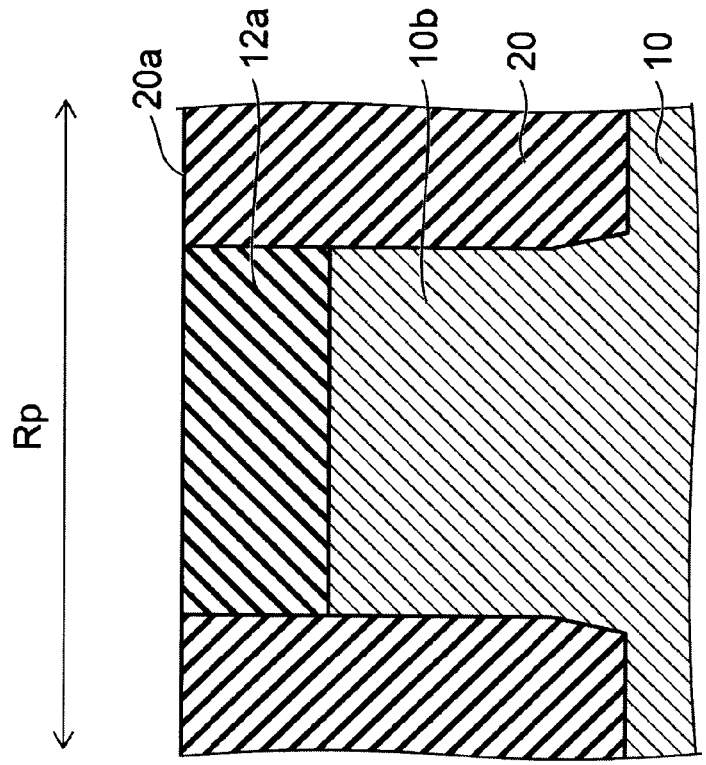

FIGS. 21A and 21B and FIGS. 22A and 22B are process cross-sectional views illustrating a manufacturing method of a semiconductor device according to the comparative example. FIGS. 21 and 22A illustrate the fin type transistor area and FIGS. 21B and 22B illustrate the planar transistor area.

In the comparative example, in both the fin type transistor area Rf and the planar transistor area Rp, the silicon is nitride film 12 is formed but the silicon nitride film 14 is not formed.

In this case, when the hard mask material 15, the hard mask material 16, and the antireflective film 17 are formed on the silicon nitride film 12, the height of the upper surface of the antireflective film 17 can be the same between the area Rf and the area Rp. Therefore, the height of the foundation layer of the resist mask 52 can be the same.

Figure 21A:
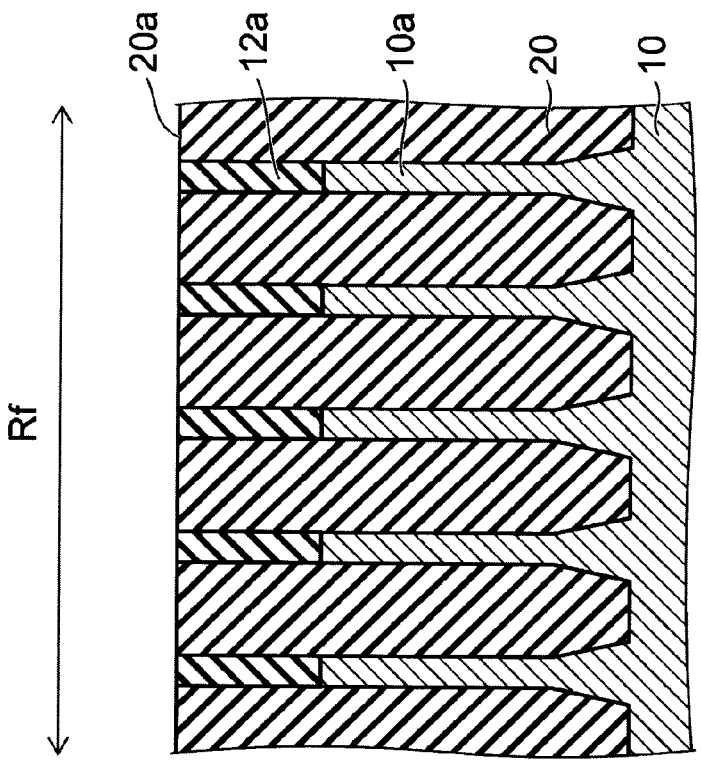

As shown in FIGS. 21A and 21B, when the CMP is performed on the upper surface 20a of the element isolation insulating film 20, the silicon nitride member 12a functions as a stopper in both the area Rf and the area Rp, so that the position of the upper surface 20a can be the same.

However, in the comparative example, as shown in FIGS. 22A and 22B, even immediately before the process for forming the gate electrode, there is the silicon nitride member 12a in the planar transistor area Rp, so that it is difficult to accurately remove the silicon nitride member 12a only from the planar transistor area Rp. For example, it can be considered that a resist mask that covers the fin type transistor area Rf and exposes the planar transistor area Rp is formed and the silicon nitride member 12a is removed from only the planar transistor area Rp by wet etching using phosphoric acid or plasma etching. However, doing so damages the upper surfaces of the gate insulating film 31 and the device area 10b and degrades the properties of the planar transistor 40b markedly.

Next, a second embodiment will be described.

Figure 23A:
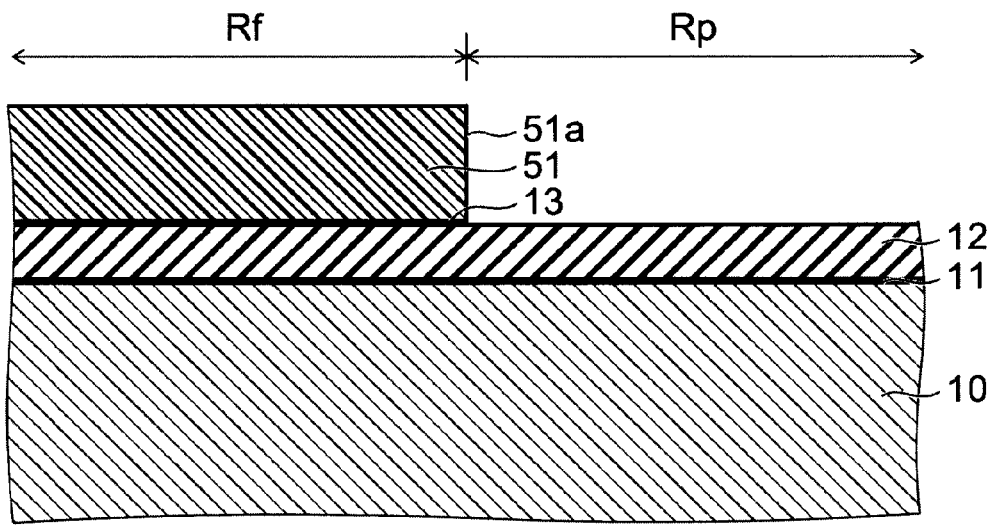
FIGS. 23A and 23B are process cross-sectional views illustrating a manufacturing method of a semiconductor device according to a second embodiment.
Figure 23B:
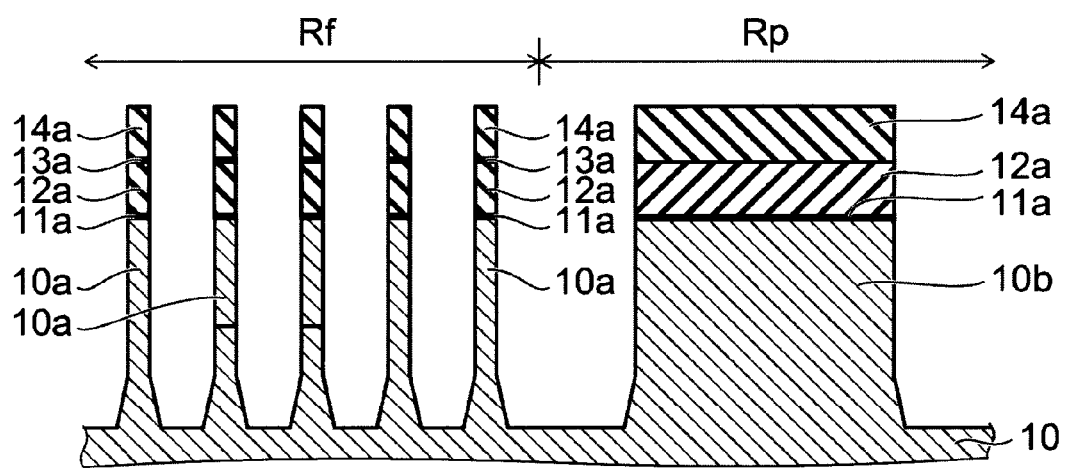

FIGS. 23A and 23B are process cross-sectional views illustrating a manufacturing method of a semiconductor device according to the embodiment.

FIG. 23A corresponds to FIGS. 2A and 2B in the first embodiment described above and FIG. 23B corresponds to FIGS. 7A and 7B.

In the embodiment, the formation position of the resist mask 51 for selectively removing the silicon nitride film 14 will be described in detail.

As shown in FIG. 23A, in the embodiment, an end edge 51a of the resist mask 51 is located on a boundary between the fin type transistor area Rf and the planar transistor area Rp. Thereby, the boundary of an area in which the silicon oxide film 13 is removed is located on the boundary between the fin type transistor area Rf and the planar transistor area Rp, so that it is possible to remove the silicon oxide film 13 from the entire planar transistor area Rp and leave the silicon oxide film 13 in the entire fin type transistor area Rf. The element isolation insulating film 20 (see FIGS. 8A and 8B) is buried between the fin 10a and the device area 10b. Therefore, the boundary of the area in which the silicon oxide film 13 is removed is located on the element isolation insulating film 20 instead of a device such as the fin type transistor 40a and the planar transistor 40b.

The configuration, the manufacturing method, and the functions and effects of the embodiment are the same as those of the first embodiment except for those described above.

Next, a third embodiment will be described.

Figure 24:
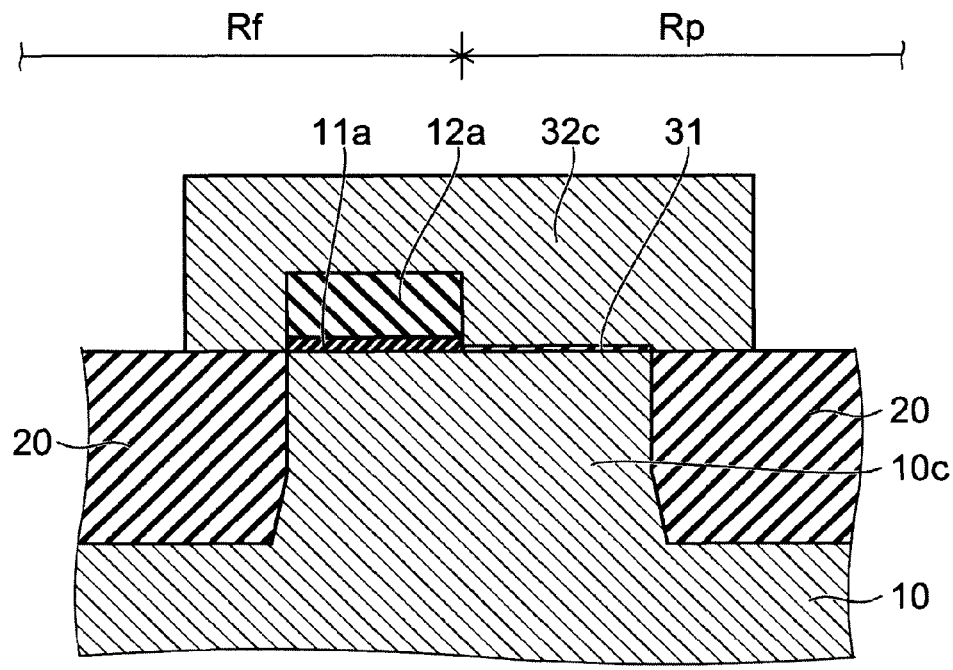
FIG. 24 is a cross-sectional view illustrating a semiconductor device according to a third embodiment.

FIG. 24 is a cross-sectional view illustrating a semiconductor device according to the embodiment.

The embodiment is an example in which the boundary of the area in which the silicon oxide film 13 is removed is located on a guard ring.

As shown in FIG. 24, in the embodiment, in an area including the boundary between the fin type transistor area Rf and the planar transistor area Rp, guard rings 10c and 32c are formed to enclose the fin type transistor area Rf.

Specifically, in the process shown in FIGS. 2A and 2B, the end edge of the resist mask 51 is located on the boundary between the fin type transistor area Rf and the planar transistor area Rp. Also, in the process for selectively removing an upper layer portion of the silicon substrate 10 shown in FIGS. 7A and 7B, a frame-shaped convex portion enclosing the fin type transistor area Rf is left as the guard ring 10c in an area including the boundary between the area Rf and the area Rp. Thereby, in the process for removing the silicon nitride member shown in FIGS. 12A and 12B, the silicon nitride member 12a is removed from outside an area immediately above the guard ring 10c, that is, from the planar transistor area Rp, and the silicon nitride member 12a is left inside the area immediately above the guard ring 10c, that is, inside the fin type transistor area Rf. Then, in the process for selectively removing the conductive film 32 shown in FIGS. 16A and 16B, the conductive film 32 is left in a frame-shaped area including the area immediately above the guard ring 10c to form the guard ring 32c.

Thereby, as shown in FIG. 24, the gate insulating film 31 is formed between an outside portion of the guard ring 10c and an outside portion of the guard ring 32c and the silicon oxide member 11a and the silicon nitride member 12a remain between an inside portion of the guard ring 10c and an inside portion of the guard ring 32c. The guard ring 10c is disposed inside the guard ring 32c as seen from above.

According to the embodiment, the guard rings 10c and 32c are provided on the boundary between the fin type transistor area Rf and the planar transistor area Rp, so that it is possible to prevent electric fields generated due to operations of peripheral circuits from affecting the operation of the memory cell.

The configuration, the manufacturing method, and the functions and effects of the embodiment are the same as those of the first embodiment except for those described above.

Next, a modified example of the third embodiment will be described.

Figure 25:
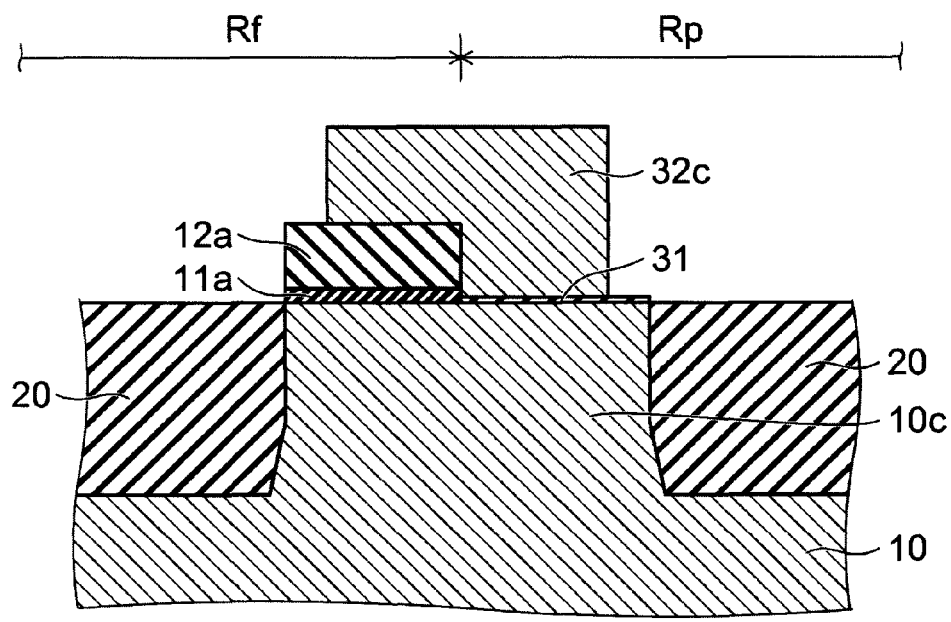
FIG. 25 is a cross-sectional view illustrating a semiconductor device according to a modified example of the third embodiment.

FIG. 25 is a cross-sectional view illustrating a semiconductor device according to the modified example.

As shown in FIG. 25, the difference of the modified example from the third embodiment is that the guard ring 32c is provided in a frame shape on part of an area immediately above the guard ring 10c. In other words, the guard ring 32c is disposed inside the guard ring 10c as seen from above.

The configuration, the manufacturing method, and the functions and effects of the embodiment are the same as those of the third embodiment except for those described above.

According to the embodiments described above, it is possible to realize a manufacturing method of a semiconductor device, which can separately manufacture a fin type transistor and a planar transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A manufacturing method of a semiconductor device, the method comprising:
    forming a lower mask film on a semiconductor substrate;
    forming a barrier film made of a material different from that of the lower mask film on the lower mask film in a first area without forming the barrier film in a second area;
    forming an upper mask film made of a material different from that of the barrier film on the lower mask film and the barrier film;
    forming an upper mask member, a barrier member, and a lower mask member respectively by selectively removing the upper mask film, the barrier film, and the lower mask film and forming an active portion by selectively removing an upper layer portion of the semiconductor substrate;
    removing the upper mask member and leaving the lower mask member in the first area and removing the upper mask member and the lower mask member in the second area by performing etching in a condition in which an etching rate of the upper mask member and an etching rate of the lower mask member are higher than an etching rate of the barrier member while protecting a side surface of the lower mask member;
    forming a conductive film so that the conductive film covers the active portion and the lower mask member; and
    selectively removing the conductive film by performing etching in a condition in which an etching rate of the conductive film is higher than the etching rate of the lower mask member.

2. The method according to claim 1, further comprising:
    forming an element isolation insulating film that buries a lower portion of the active portion in the first area and covers a side surface of the active portion in the second area; and
    forming a gate insulating film on an exposed surface of the active portion,
    wherein
    the first area is an area in which a fin type transistor is formed,
    the second area is an area in which a planar transistor is formed,
    the forming the active portion includes:
        forming a mask for substrate in which a stripe pattern extending in a first direction is formed in the first area and a pattern is formed in the second area; and
        performing etching by using the mask for substrate as a mask,
    the selectively removing the conductive film includes:
        forming a mask for conductive film in which a stripe pattern extending in a second direction crossing the first direction is formed in the first area and a pattern that traverses an area immediately above the active portion is formed in the second area, and
    in the selectively removing the conductive film,
        the etching is performed by using the mask for conductive film as a mask, and
        a gate electrode of the fin type transistor and a gate electrode of the planar transistor are formed.

3. The method according to claim 2, wherein
the forming the element isolation insulating film includes:
    forming an insulating film, in which the active portion is buried, by depositing an insulating material in both the first area and the second area and performing a planarizing process on an upper surface;
    recessing the upper surface of the insulating film in both the first area and the second area; and
    exposing an upper portion of the active portion in the first area by recessing the upper surface of the insulating film in the first area.

4. The method according to claim 2, further comprising:
forming a semiconductor layer on a surface of the active portion which is not covered by the gate electrode in the first area,
wherein a film thickness of the lower mask film is a thickness by which the lower mask member disappears in the selectively removing the conductive film.

5. The method according to claim 2, wherein
in the forming the element isolation insulating film, the element isolation insulating film is also disposed in an area including a boundary between the first area and the second area.

6. The method according to claim 2, wherein
in the forming the active portion, a lower guard ring made of an upper layer portion of the semiconductor substrate is formed in an area including a boundary between the first area and the second area, and
in the selectively removing the conductive film, an upper guard ring made of the conductive film is formed in an area including the boundary between the first area and the second area.

7. The method according to claim 1, wherein
the forming the barrier film includes:
    forming the barrier film on the lower mask film in both the first area and the second area; and
    removing the barrier film in the second area.

8. The method according to claim 1, wherein
the semiconductor substrate contains silicon,
the lower mask film and the upper mask film contain silicon nitride, and
the barrier film contains silicon oxide.

9. The method according to claim 8, wherein
the barrier film is formed by plasma oxidation of an upper surface of the lower mask film.

10. The method according to claim 1, further comprising:
forming a protective film on an exposed surface of the active portion;
forming a sidewall protective film which covers a side surface of the lower mask member and is made of a material different from any of a material of the lower mask member, a material of the barrier film, a material of the upper mask member, and a material of the protective film;
removing the sidewall protective film; and
removing the protective film,
wherein the removing the upper mask member is performed between the forming the sidewall protective film and the removing the sidewall protective film.

11. The method according to claim 10, wherein
the semiconductor substrate contains silicon,
the lower mask film and the upper mask film are formed of silicon nitride,
the barrier film and the protective film are formed of silicon oxide,
the sidewall protective film is formed of non-doped amorphous silicon, and
the sidewall protective film is removed by wet etching using an alkaline etching solution.

12. A manufacturing method of a semiconductor device, the method comprising:

forming a lower mask film made of silicon nitride in both a first area and a second area on a semiconductor substrate which contains silicon and in which the first area where a fin type transistor is formed and the second area where a planar transistor is formed are set;

forming a barrier film made of silicon oxide on the lower mask film by performing plasma oxidation on an upper surface of the lower mask film;

removing the barrier film in the second area;

forming an upper mask film made of silicon nitride on the lower mask film and the barrier film;

forming a mask for substrate, in which a stripe pattern extending in a first direction is formed in the first area and a pattern is formed in the second area, on the upper mask film;

by performing etching using the mask for substrate as a mask, forming an upper mask member, a barrier member, and a lower mask member respectively by selectively removing the upper mask film, the barrier film, and the lower mask film and forming an active portion by selectively removing an upper layer portion of the semiconductor substrate;

forming an insulating film so that the active portion is buried in the insulating film by depositing an insulating material in both the first area and the second area and performing a planarizing process on an upper surface;

recessing the upper surface of the insulating film in both the first area and the second area;

forming an element isolation insulating film in which a lower portion of the active portion is buried in the first area and which covers a side surface of the active portion in the second area and is also disposed in an area including a boundary between the first area and the second area by recessing the upper surface of the insulating film in the first area and exposing an upper portion of the active portion in the first area;

forming a protective film made of silicon oxide on an exposed surface of the active portion;

forming a sidewall protective film which covers a side surface of the lower mask member and which is made of non-doped amorphous silicon;

removing the upper mask member and leaving the lower mask member in the first area and removing the upper mask member and the lower mask member in the second area by performing etching in a condition in which an etching rate of the upper mask member and an etching rate of the lower mask member are higher than an etching rate of the barrier member;

removing the sidewall protective film by wet etching using an alkaline etching solution;

removing the protective film;

forming a gate insulating film on an exposed surface of the active portion;

forming a conductive film so that the conductive film covers the active portion and the lower mask member;

forming a mask for conductive film, in which a stripe pattern extending in a second direction crossing the first direction is formed in the first area and a pattern that traverses an area immediately above the active portion is formed in the second area, on the conductive film;

by performing etching using the mask for conductive film and the lower mask member as a mask in a condition in which an etching rate of the conductive film is higher than the etching rate of the lower mask member, forming a gate electrode of the fin type transistor and a gate electrode of the planer transistor by selectively removing the conductive film and at the same time removing the lower mask member; and forming a semiconductor layer on a surface of the active portion which is not covered by the gate electrode in the first area.

* * * * *